(12) United States Patent
Ohtsuki et al.

(10) Patent No.: US 7,800,191 B2
(45) Date of Patent: Sep. 21, 2010

(54) SOLID-STATE IMAGING DEVICE AND METHOD FOR DRIVING THE SAME

(75) Inventors: Hirohisa Ohtsuki, Hyogo (JP); Motonari Katsuno, Kyoto (JP); Ryohei Miyagawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 200 days.

(21) Appl. No.: 11/716,743

(22) Filed: Mar. 12, 2007

(65) Prior Publication Data

US 2007/0210398 A1   Sep. 13, 2007

(30) Foreign Application Priority Data

Mar. 13, 2006  (JP) ............... 2006-067073
Mar. 13, 2006  (JP) ............... 2006-067079

(51) Int. Cl.
*H01L 31/042* (2006.01)
(52) U.S. Cl. ............ 257/432; 257/428; 257/431; 257/E31.001; 438/48; 438/65
(58) Field of Classification Search ........... 257/146, 257/202, 291, 428, 431, 432, E31.001; 438/129, 438/48, 65
See application file for complete search history.

(56) References Cited

U.S. PATENT DOCUMENTS 6,838,715 B1 *   1/2005   Bencuya et al. ............ 257/291

2004/0126934 A1 *   7/2004   Itano et al. ............ 438/129
2004/0238850 A1 *   12/2004   Kusumoto ............ 257/202
2006/0132633 A1 *   6/2006   Nam et al. ............ 348/308

FOREIGN PATENT DOCUMENTS

| JP | 2002-335455 | 11/2002 |
|---|---|---|
| JP | 2004-186407 | 7/2004 |
| JP | 2004-273566 | 9/2004 |
| JP | 2004-273759 | 9/2004 |
| JP | 2005-142251 | 6/2005 |
| JP | 2005-268537 | 9/2005 |

* cited by examiner

*Primary Examiner*—Bradley K Smith
*Assistant Examiner*—Marvin Payen
(74) *Attorney, Agent, or Firm*—McDermott Will & Emery LLP

(57) ABSTRACT

A pixel array is provided in which cells are arranged in a matrix. Each cell includes a photodiode, an FD, a transfer transistor, a reset transistor, an amplifying transistor having a gate electrode connected to the FD, a drain connected to a power supply line, and a source connected to a vertical signal line, and an FD wire. The FD wire is provided in a first wiring line, and the vertical signal line is provided in a second wiring line positioned over the first wiring layer. Since the potential of the FD wire follows the potential of the vertical signal line, it is possible to suppress a variation in capacitance occurring in the FD when a position of the vertical signal is shifted, depending on a position of the cell.

14 Claims, 32 Drawing Sheets

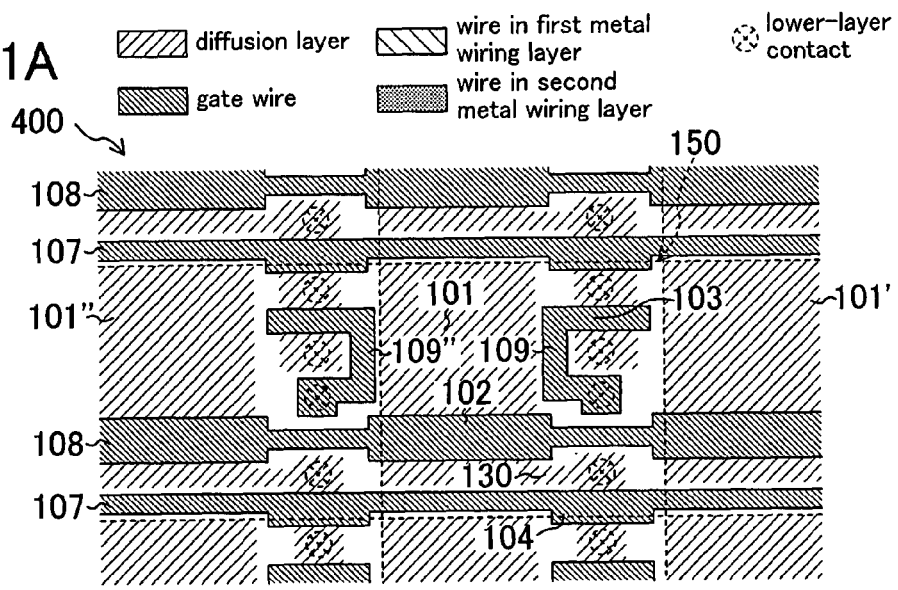
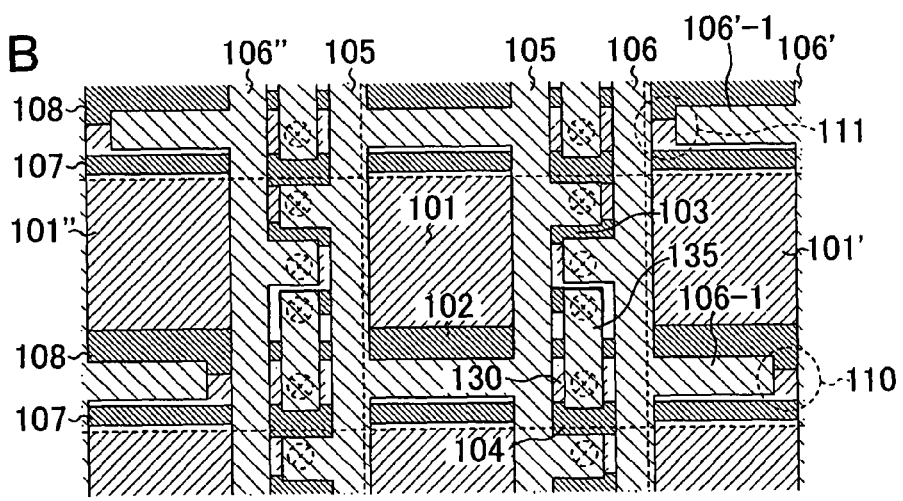
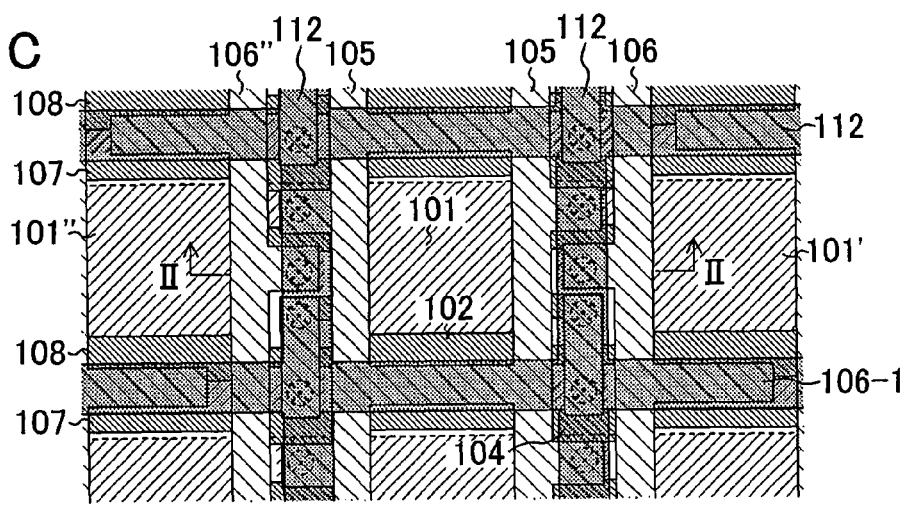

| | | |
|---|---|---|
| ▨ diffusion layer | ▨ wire in first metal wiring layer | ◌ lower-layer contact |
| ▨ gate wire | ▨ wire in second metal wiring layer | ⊠ contact connecting first and second metal wiring layers |

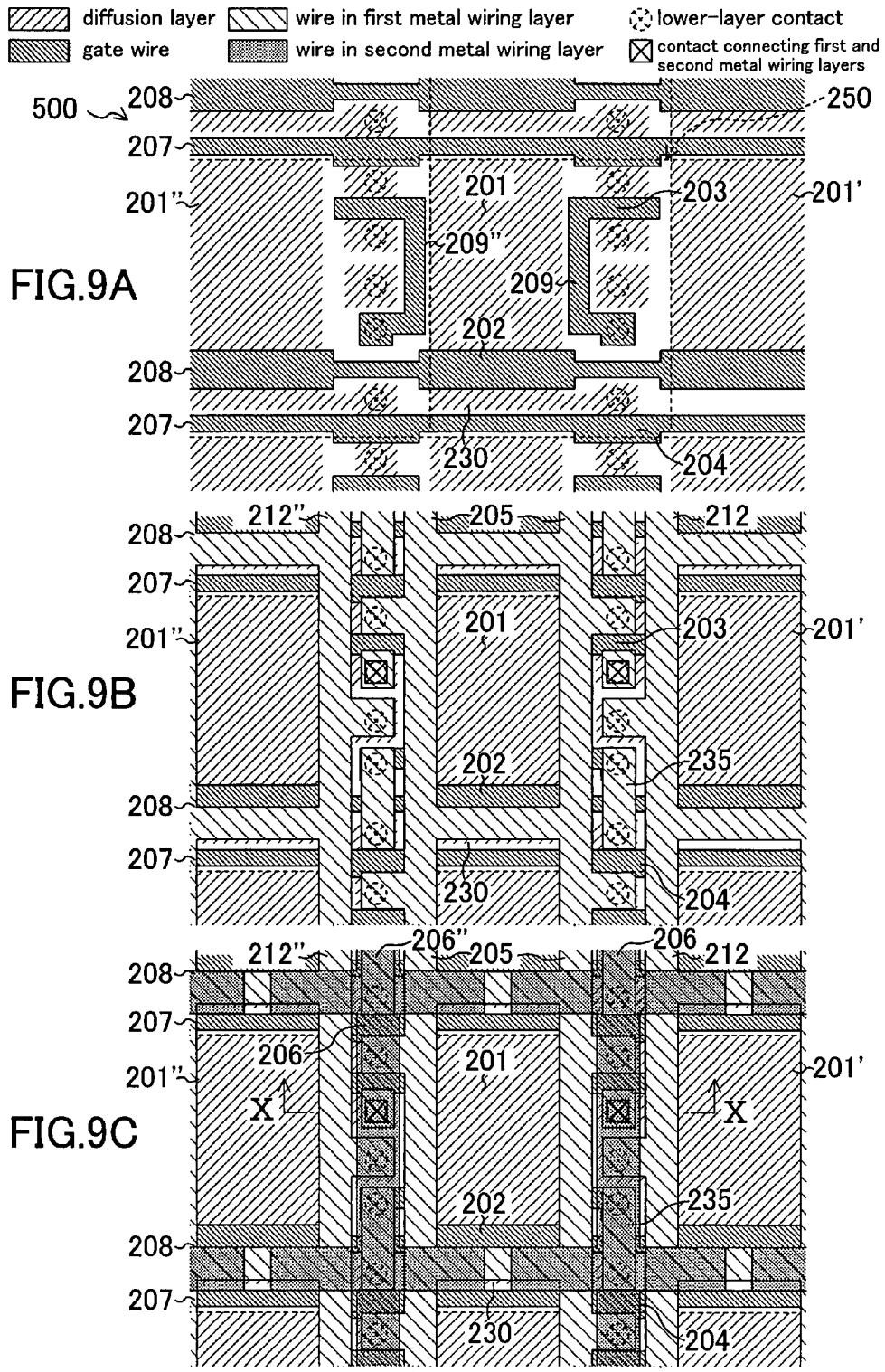

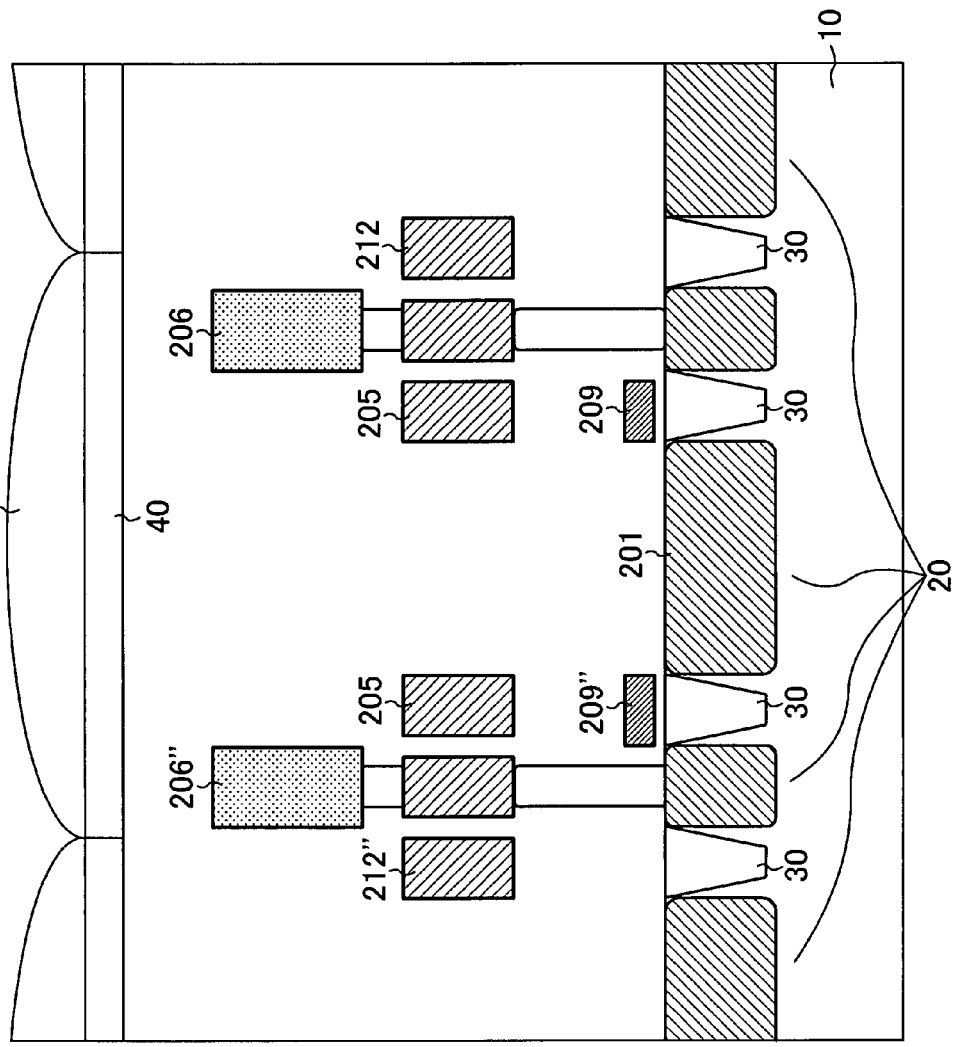

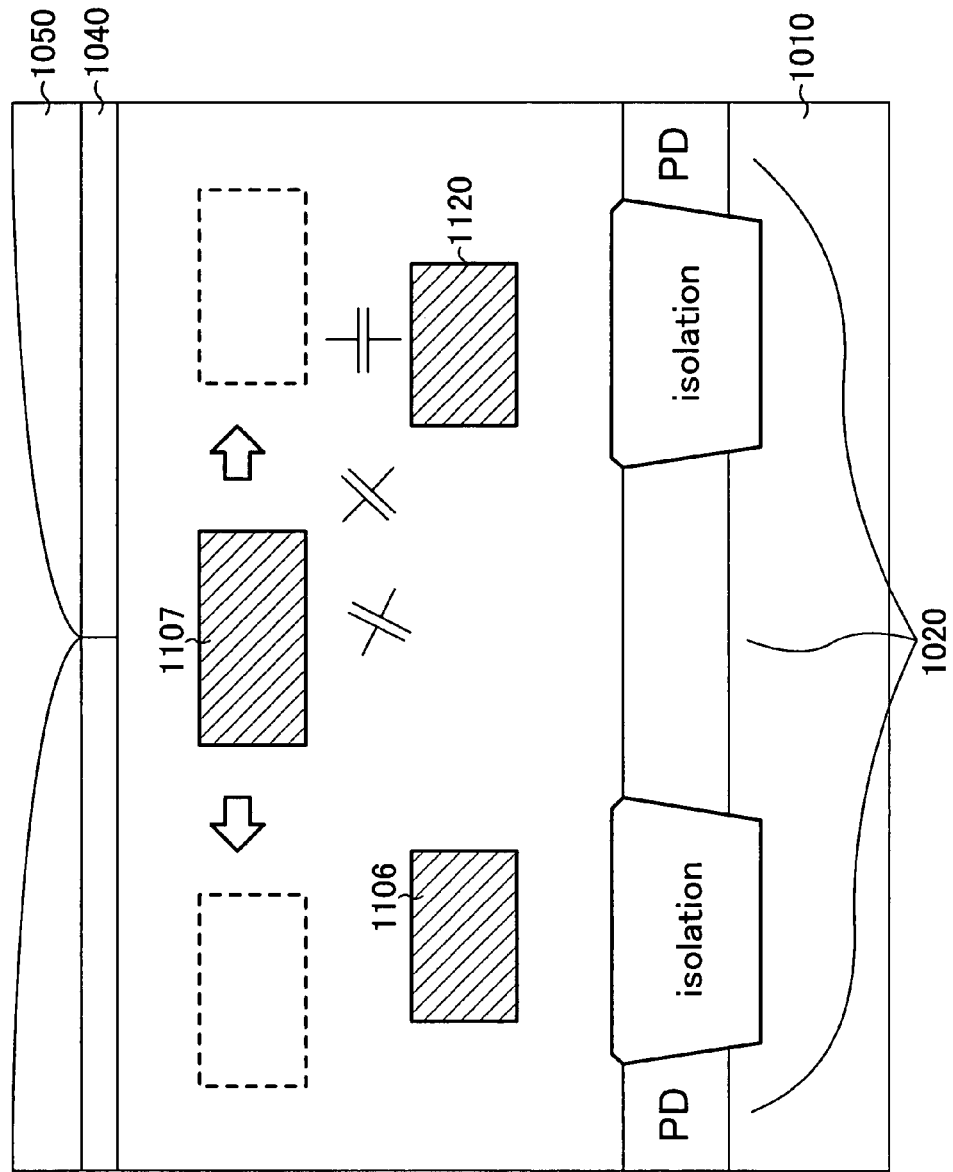

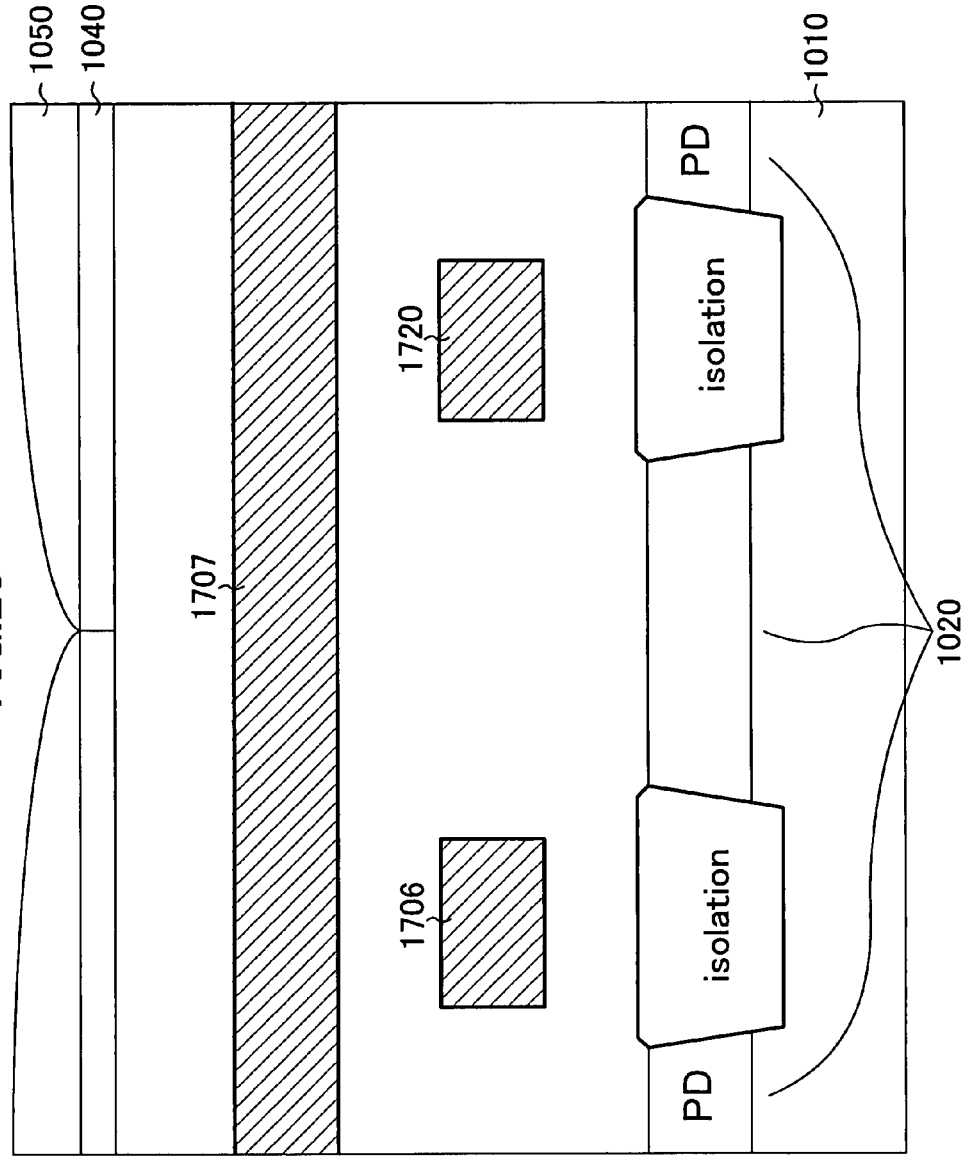

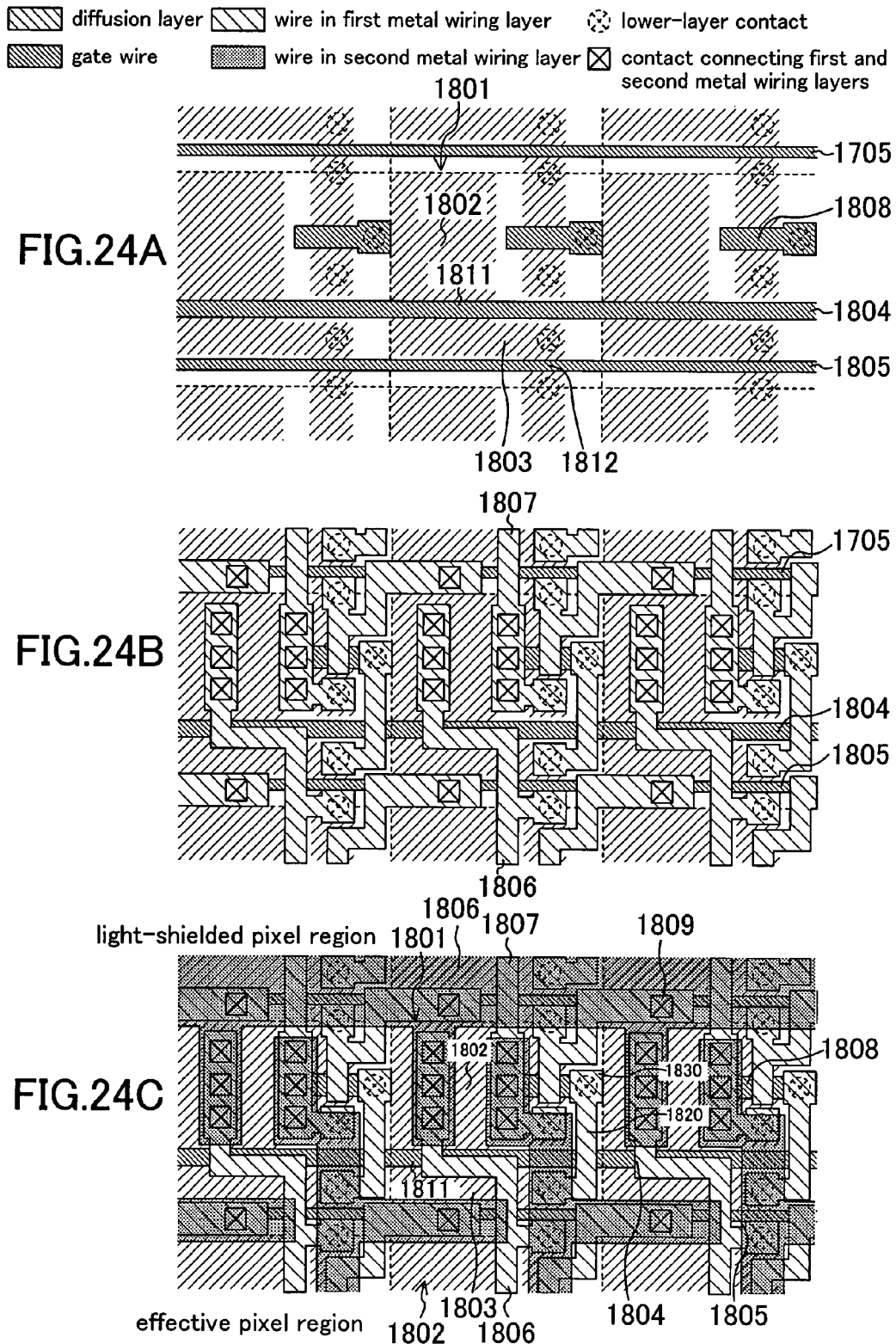

▧ diffusion layer   ▨ wire in first metal wiring layer   ⊙ lower-layer contact
▨ gate wire   ▦ wire in second metal wiring layer   ⊠ contact connecting first and second metal wiring layers

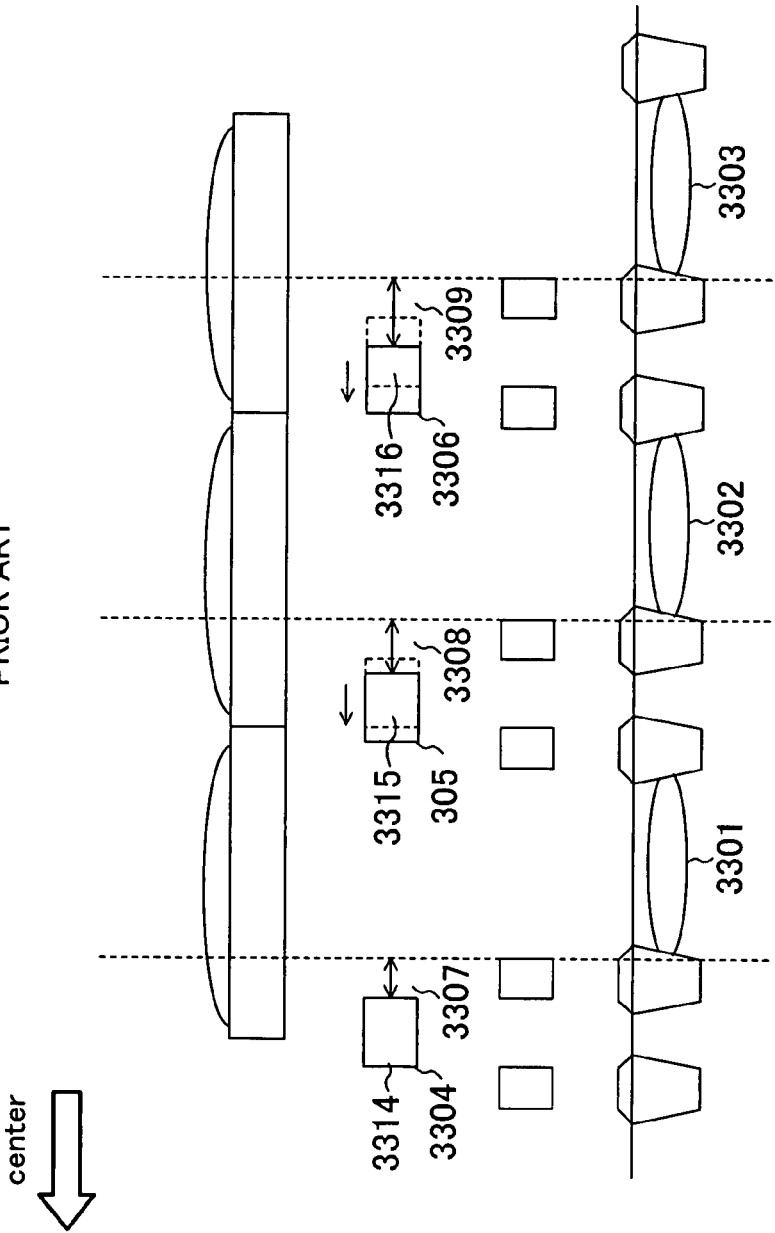

SOLID-STATE IMAGING DEVICE AND METHOD FOR DRIVING THE SAME

BACKGROUND OF THE INVENTION

1. Field of the Invention

The present invention relates to a MOS solid-state imaging device for use in a digital camera or the like, and a method for driving the same.

2. Description of the Related Art

In recent years, as the function, miniaturization level and the like of imaging elements are improved, solid-state imaging devices (imaging chips) including the imaging element are employed within an increasing range of applications. For example, while a solid-state imaging device having a miniaturized imaging element is incorporated into a mobile telephone or the like, a solid-state imaging device adapted to improve image quality is used in a high-grade digital camera or the like, such as a single-lens reflex camera or the like. Solid-state imaging devices used in any products have basic common features, and each comprise a pixel array of a plurality of cells which receive external light.

FIGS. 27A to 27C are plan views illustrating cells in a MOS solid-state imaging device according to a first conventional example. FIG. 27A illustrates an impurity diffusion layer and a polysilicon wiring layer formed on a semiconductor substrate, and contacts connecting between the semiconductor substrate or the polysilicon wiring layer and wires of a first metal wiring layer. FIG. 27B is a plan view illustrating wires formed in the first metal wiring layer in addition to the configuration of 27A. FIG. 27C is a plan view illustrating wires formed in a second metal wiring layer in addition to the configuration of FIG. 27B. FIG. 28 is a diagram illustrating a cross-section of the solid-state imaging device of the first conventional example, taken along line XXVIII-XXVIII of FIG. 27C.

As illustrated in FIGS. 27A to 27C, each conventional cell comprises: a photodiode 2501 which accumulates an amount of electric charges corresponding to the intensity of received light; a floating diffusion (hereinafter abbreviated as "FD") 2530 to which electric charges accumulated by the photodiode 2501 are transferred; a transfer transistor 2502 which is controlled by the potential of a transfer gate wire 2508 to control transfer of electric charges from the photodiode 2501 to the FD 2530; a reset transistor 2704 which is controlled by a reset gate wire 2507 to initialize the potential of the FD 2530; an amplifying transistor 2703 which has a gate electrode connected to the FD 2530, a drain connected to a power supply line 2505, and a source to a vertical signal line 2506 to form a source follower; an FD wire 2535 which connects a gate wire 2509 of the amplifying transistor 2703 and the FD 2530; and a wire 2513. In the example of FIGS. 27A to 27C, the power supply line 2505 and the vertical signal line 2506 are formed in the first metal wiring layer, and the wire 2513 is formed in the second metal wiring layer. The FD wire 2535 is formed in the first metal wiring layer, and the gate wire 2509 is formed in the polysilicon wiring layer. In the pixel array, the cells and the photodiodes 2501 are arranged in a matrix (array). The FD wire 2535 and the gate wire 2509 are formed in each cell. In FIGS. 27A to 27C, a gate wire in a cell adjacent to the cell in which the gate wire 2509 is provided is indicated as a gate wire 2509". Also, a vertical signal line adjacent to the vertical signal line 2506 is indicated as a vertical signal line 2506" for the sake of convenience.

FIG. 29 is a diagram illustrating an outline of the pixel array of the conventional solid-state imaging device. As illustrated in FIG. 29, in the conventional solid-state imaging device, a plurality of cells 2600 are arranged in a matrix to form a pixel array. A substrate contact wire 2540 is provided for each column of cells 2600, and is shared by a plurality of cells 2601 for substrate contact provided in the column. In the pixel array, a substrate contact cell 2601 is provided every a predetermined number of pixels.

FIG. 30 is a schematic diagram illustrating another exemplary pixel array of a conventional solid-state imaging device. A color filter is provided on each pixel so that the pixel recognizes any of G (green), R (red), and B (blue). In this example, the pixel array is composed of units each of which includes 2×2 pixels which recognize G, R and B. This color arrangement is generally called a Bayer array.

An operation of the thus-configured solid-state imaging device will be described.

Initially, when a vertical shift register (not shown) outputs a reset pulse signal, the reset transistor 2704 (see FIGS. 27A to 27C) is operated so that the FD 2530 is initialized to the potential of the power supply line 2505. Next, when light impinges on the photodiode 2501, electric charges are accumulated in the photodiode 2501. Thereafter, electric charges accumulated in the photodiode 2501 are transferred to the FD 2530 via the transfer transistor 2502 selected by the vertical shift register. The potential of the FD 2530 is changed by the transferred electric charges. When the potential of the FD 2530 is changed, the potential of the vertical signal line 2506 is changed via the amplifying transistor 2703. The change in the potential of the vertical signal line 2506 is transmitted through a noise suppressing circuit (not shown), and is then output to a horizontal signal line which is controlled by a transistor in a column selected by a horizontal shift register.

FIG. 31 is a circuit diagram illustrating a cell of a general MOS solid-state imaging device.

As illustrated in FIG. 31, a cell 2901 comprises: a photodiode 2902 which accumulates an amount of electric charges corresponding to the intensity of received light; a floating diffusion (hereinafter abbreviated as "FD") 2903 to which electric charges accumulated by the photodiode 2902 are transferred; a transfer transistor 2911 which is controlled by a transfer gate wire 2904 to control transfer of electric charges from the photodiode 2902 to the FD 2903; a capacitance including a wire capacitance and the like connected to the FD 2903; a reset transistor 2912 which is controlled by a reset gate wire 2905 to initialize the potential of the FD 2903; and an amplifying transistor 2908 which has a gate electrode connected to the FD 2903, a drain connected to a power supply line 2906, and a source connected to a vertical signal line 2907 to form a source follower. In FIG. 31, the FD 2903 is illustrated as a node between the drain of the transfer transistor 2911 and the gate electrode of the amplifying transistor 2908. The transfer transistor 2911, the reset transistor 2912, and the FD 2903 function as a read control circuit 2909.

FIGS. 32A to 32C are plan views illustrating an exemplary layout of a conventional pixel array (second conventional example). FIG. 32A illustrates a polysilicon wiring layer, and contacts connecting a diffusion layer or polysilicon wires formed on a semiconductor substrate and a first metal wiring layer, in the pixel array. FIG. 32B illustrates wires formed in the first metal wiring layer or below, and each contact. FIG. 32C illustrates wires formed in a second metal wiring layer or below, and each contact. In FIGS. 32A to 32C, each portion surrounded by a dashed line is a cell 2901.

As illustrated in FIGS. 32A to 32C, the gate electrode of the transfer transistor 2911 and the gate electrode of the amplifying transistor 2908 are formed in the polysilicon wiring layer, and the first metal wire 2907 and a second metal wire 2920 are each formed in the first metal wiring layer. The third metal wire 2906 is formed in the second metal wiring layer.

FIG. 33 is a diagram illustrating an exemplary conventional layout of a pixel array 3001 in which a plurality of cells are arranged (third conventional example). In the conventional pixel array 3001, a light-shielded pixel region 3202 is provided around an effective pixel region 3201. The light-shielded pixel region 3202 is provided so as to detect a black color which may be used as a reference. In the light-shielded pixel region 3202, a metal wire is provided over an entire surface of the cell so that light is blocked from entering the photodiode.

FIG. 34 is a diagram illustrating an exemplary cross-section in the effective pixel region of the pixel array of the conventional solid-state imaging device.

In order to improve the oblique incident light characteristics of photodiodes 3301, 3302 and 3303, wires 3314, 3315 and 3316 are shifted from positions 3307, 3308 and 3309 to positions 3304, 3305 and 3306, i.e., toward a center line of the pixel array, by amounts which increase with an increase in the distances of the wires from the center line. Shifting the position of a wire toward the center line is referred to as "shrink".

SUMMARY OF THE INVENTION

However, in the solid-state imaging device of the first conventional example of FIGS. 27A to 27C, when viewed from the photodiode 2501, the wires each have a laterally (in the row direction) different shape. Therefore, in the conventional solid-state imaging device, light enters in laterally different manners, so that irregularity may occur in the brightness of an output image. Hereinafter, the irregularity in the brightness of an output image is referred to as "shading".

Also, when viewed from the photodiode 2501, the gate wires laterally positioned have different shapes. Therefore, photoelectric conversion characteristics may vary in the photodiode 2501 due to stress or the like. Such a defect causes a significant problem, particularly in applications which require high image quality.

In the solid-state imaging devices of FIGS. 32 and 33, a capacitance between an FD and a metal wire in the pixel array varies due to shrink, likely leading to the occurrence of shading. Since a gap between wiring layers is reduced so as to improve oblique incident light characteristics in recent years, the capacitance variation has a more significant influence.

In view of the above-described problems, the present invention is provided. An object of the present invention is to provide a solid-state imaging device in which a wire layout in the pixel array is designed so as to suppress the occurrence of shading.

The solid-state imaging device of the present invention comprises a pixel array including photodiodes for accumulating an amount of electric charges corresponding to the intensity of received light, floating diffusions to which electric charges accumulated by the photodiodes are transferred, transfer transistors for controlling transfer of electric charges from the photodiodes to the floating diffusions, and amplifying transistors having a source from which a signal corresponding to electric charges transferred to the floating diffusion is output, with a plurality of cells being provided in the pixel array, at least a power supply line provided over the pixel array and connected to drains of the amplifying transistors, at least a vertical signal line provided over the pixel array and connected to sources of the amplifying transistors, and a plurality of floating diffusion wires provided over the pixel array, connecting gate electrodes of the amplifying transistors and the transfer transistors. In each of the plurality of cells, at least a pair of the photodiode and the transfer transistor connected to the photodiode is provided. The floating diffusion wire is provided in a first wiring layer while the vertical signal line is provided in a second wiring layer positioned over the first wiring layer, over at least a partial region of the pixel array. The photodiodes are preferably arranged in a matrix. Note that the "at least a partial region of the pixel array" as used herein refers to an effective pixel region for outputting an effective video signal.

In the solid-state imaging device, when a signal is read from the source of the amplifying transistor, the potential of the vertical signal line changes, following the potential of the floating diffusion and floating diffusion wire.

Over the at least a partial region of the pixel array, the vertical signal line may be increasingly shifted toward a center line extending in the column direction of the pixel array as a distance between the vertical signal line and the center line of the pixel array increases. In this case, the occurrence of shading can be effectively suppressed. Therefore, according to the present invention, it is possible to achieve a solid-state imaging device in which oblique incident light characteristics are improved, and the occurrence of shading is suppressed.

Also, when, over each cell, contacts connecting the first wiring layer and the second wiring layer are provided at positions in the column direction as viewed from the photodiode, the incident characteristics of light obliquely entering from the row direction to the photodiode can be improved. Also, when contacts connecting the first wiring layer and the second wiring layer are provided at positions in the row direction as viewed from the photodiode, the incident characteristics of light obliquely entering from the column direction to the photodiode can be improved. Alternatively, when contacts are provided at positions in the row direction and in the column direction as viewed from the photodiode, the amounts of light obliquely entering from the row direction and from the column direction can be caused to be the same.

Also, if a portion of the vertical signal line provided for each column is branched so the a region over each photodiode is partitioned, light which should enter an adjacent cell can be prevented from a photodiode of interest, thereby making it possible to suppress the occurrence of a mixed color. Also, since adjacent vertical signal lines cannot be connected to each other, a gap (space) needs to be provided between the adjacent vertical signal lines. If the space has a minimum width in the same layer in the pixel array, the occurrence of a mixed color can be suppressed. By providing the space at a corner position when viewed from the photodiode, a variation in capacitance occurring in each cell can be suppressed without a deterioration in oblique incident light characteristics.

In the pixel array, a light-shielded pixel region which is provided around the effective pixel region is preferably formed in addition to the effective pixel region. Over the light-shielded pixel region, the vertical signal line is provided in the first wiring layer, and the power supply line is provided in the second wiring layer, while covering over the entirety of the cells in the light-shielded pixel region. Thereby, a signal output from the cell in the light-shielded pixel region can be used to set a black color as a reference, resulting in an improvement of quality of video (or an image).

When the vertical signal line and the power supply line are provided in different wiring layers between over the light-shielded pixel region and over the effective pixel region, a wiring layer changing region is required which is provided between the effective pixel region and the light-shielded pixel region and adjacent in the column direction to the effective pixel region. The wiring layer changing region may be composed of a plurality of rows of cells, or may be composed of a single row of cells. In the latter case, in one cell, a contact for changing wiring layers in which the vertical signal line is provided, from the second wiring layer to the first wiring layer, and a contact for changing wiring layers in which the power supply line is provided, from the first wiring layer to the second wiring layer, are provided.

The wire layout and the like over the wiring layer changing region are different from those over the effective pixel region. Therefore, by processing a signal output from a cell in the wiring layer changing region as an invalid signal, high-quality video can be obtained.

For example, the solid-state imaging device may further comprises a wire changing pixel determining section for determining whether or not the signal read via the vertical signal line is a signal output from the source of the amplifying transistor provided in the wiring layer changing region, a dummy signal generating section for outputting a dummy signal instead of the signal when it is determined that the signal is a signal output from the source of the amplifying transistor provided in the wiring layer changing region, and a video signal processing section for processing the signals output from the sources of the amplifying transistors provided in the effective pixel region and the light-shielded pixel region, and invalidating the dummy signal. Since the circuit for signal processing is formed on the same chip on which the pixel array is formed, a whole size of an imaging apparatus comprising the solid-state imaging device can be reduced.

Of the transfer transistor, a transfer transistor provided in the wiring layer changing region may be invariably in an inactive state.

When a solid-state imaging device comprising a pixel array in which an effective pixel region, a light-shielded pixel region, and a wiring layer changing region are formed, is employed, it is necessary to invalidate a signal from the wiring layer changing region as described above.

Therefore, a method for driving the solid-state imaging device according to the present invention comprises steps of (a) reading the signal from the source of the amplifying transistor provided in any one of the plurality of cells via the vertical signal line, (b) determining whether or not the signal is a signal output from the source of the amplifying transistor provided in the wiring layer changing region, (c) generating a dummy signal instead of the signal when it is determined that the signal is a signal output from the source of the amplifying transistor provided in the wiring layer changing region, and (d) processing the dummy signal as an invalid signal.

BRIEF DESCRIPTION OF THE DRAWINGS

FIGS. 1A to 1C are plan views illustrating a layout of a pixel array of a MOS solid-state imaging device according to a first embodiment of the present invention.

FIGS. 9A to 9C are plan views illustrating a layout of a pixel array of a solid-state imaging device according to a second embodiment of the present invention.

FIG. 10 is a cross-sectional view of the solid-state imaging device of the second embodiment, taken along line X-X of FIGS. 9A to 9C.

FIG. 17 is a cross-sectional view of the solid-state imaging device of the fifth embodiment, taken along line XVII-XVII of FIG. 16C.

FIG. 23 is a cross-sectional view of the solid-state imaging device of the ninth embodiment, taken along line XXIII-XXIII of FIG. 22C.

FIGS. 24A to 24C are plan views illustrating a layout of cells provided in the wiring layer changing region of the solid-state imaging device of the ninth embodiment.

FIG. 34 is a diagram illustrating an exemplary cross-section in an effective pixel region of the pixel array of the conventional solid-state imaging device.

DETAILED DESCRIPTION OF THE PREFERRED EMBODIMENTS

Hereinafter, preferred embodiments of the present invention will be described with reference to the accompanying drawings.

First Embodiment

Figure 2:
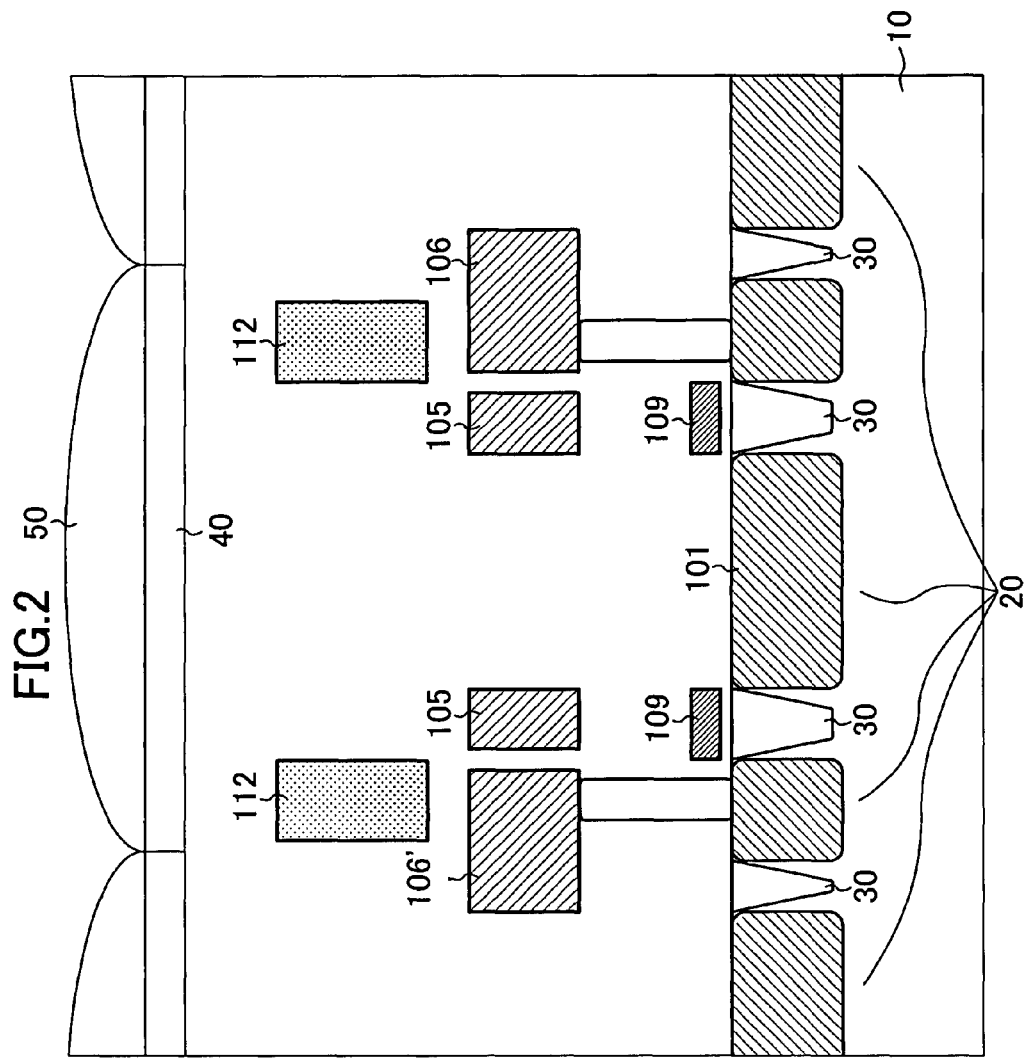
FIG. 2 is a cross-sectional view of the solid-state imaging device of the first embodiment, taken along line II-II of FIGS. 1A to 1C.
Figure 3:
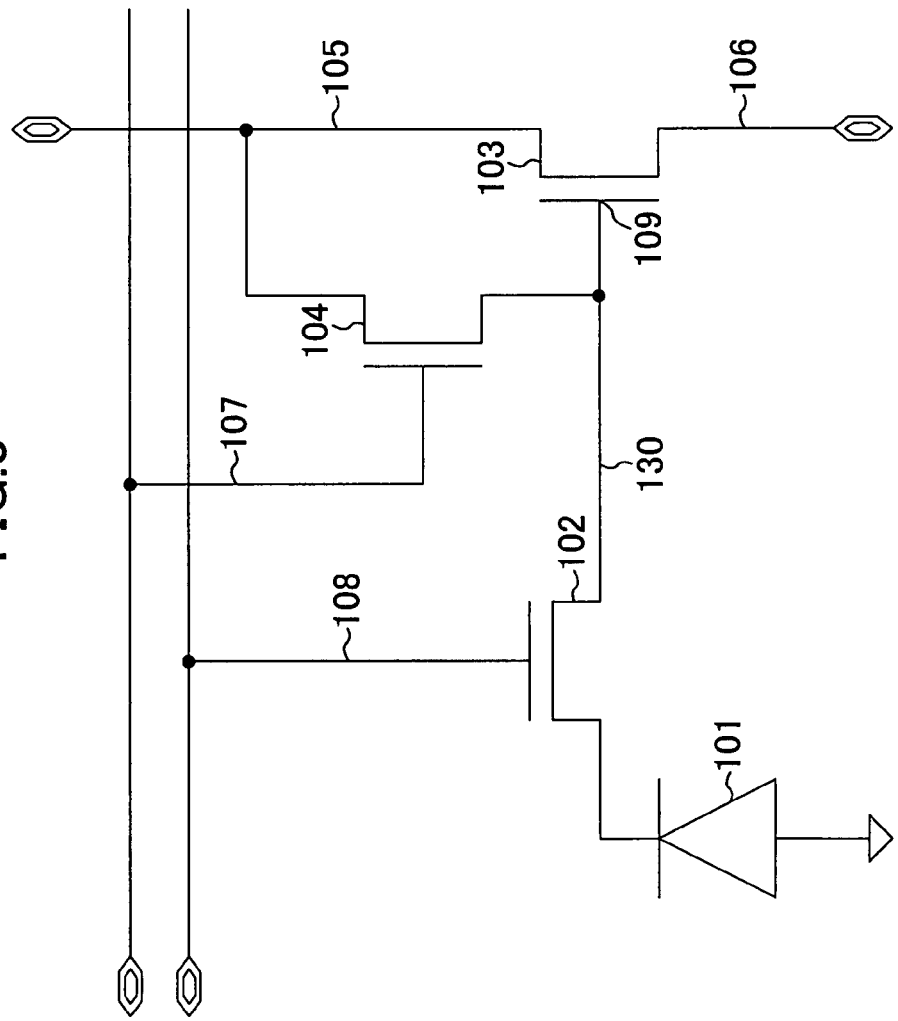
FIG. 3 is a circuit diagram illustrating a cell in the solid-state imaging device of the first embodiment.

FIGS. 1A to 1C are plan views illustrating a layout of a pixel array of a solid-state imaging device (MOS solid-state imaging device) according to a first embodiment of the present invention. FIG. 1A illustrates, in the pixel array, a polysilicon wiring layer, and contacts (lower-layer contacts) connecting a diffusion layer or polysilicon wires formed on a semiconductor substrate, and wires in a first metal wiring layer. FIG. 1B illustrates wires formed in the first metal wiring layer in addition to the configuration of FIG. 1A. FIG. 1C further illustrates wires formed in a second metal wiring layer in addition to the configuration of FIG. 1B. In FIGS. 1A to 1C, each portion surrounded by a dashed line is a cell 150. When one photodiode is provided in each cell as in the solid-state imaging device of this embodiment, the cell is generally called a "pixel cell". FIG. 2 is a cross-sectional view of the solid-state imaging device of the first embodiment, taken along line II-II of FIGS. 1A to 1C. FIG. 3 is a circuit diagram illustrating the cell 150 in the solid-state imaging device of the first embodiment.

As illustrated in FIGS. 1A to 1C, 2 and 3, the cell 150 in the solid-state imaging device of this embodiment comprises: a photodiode 101 which accumulates an amount of electric charges corresponding to the intensity of received light; an FD 130 to which electric charges accumulated by the photodiode 101 are transferred; a transfer transistor 102 which is controlled by the potential of a transfer gate wire 108 to control transfer of electric charges from the photodiode 101 to the FD 130; a reset transistor 104 which is controlled by a reset gate wire 107 to initialize the potential of the FD 130; an amplifying transistor 103 which has a gate electrode connected to the FD 130, a drain connected to a power supply line 105, and a source connected to a vertical signal line 106 to form a source follower; a gate wire 109 of the amplifying transistor 103; an FD wire 135 which connects the FD 130 and the gate wire 109; and a substrate contact wire 112.

As illustrated in FIG. 2, an STI (Shallow Trench Isolation) is formed in an isolation region 30 on a semiconductor substrate 10. Thereafter, the photodiode 101 is formed in an active region 20 surrounded by the isolation region 30. An interlayer insulating film is formed between the polysilicon wiring layer and the first wiring layer and between the first wiring layer and the second wiring layer. Color filters 40 are formed over the second wiring layer via an interlayer insulating film, and microlenses 50 for collecting incident light onto the photodiodes 101 are formed on the color filters 40. The color filters 40 have, for example, three colors (blue, green and red). The color filter 40 having any one of the colors is provided over each photodiode.

Figure 4:
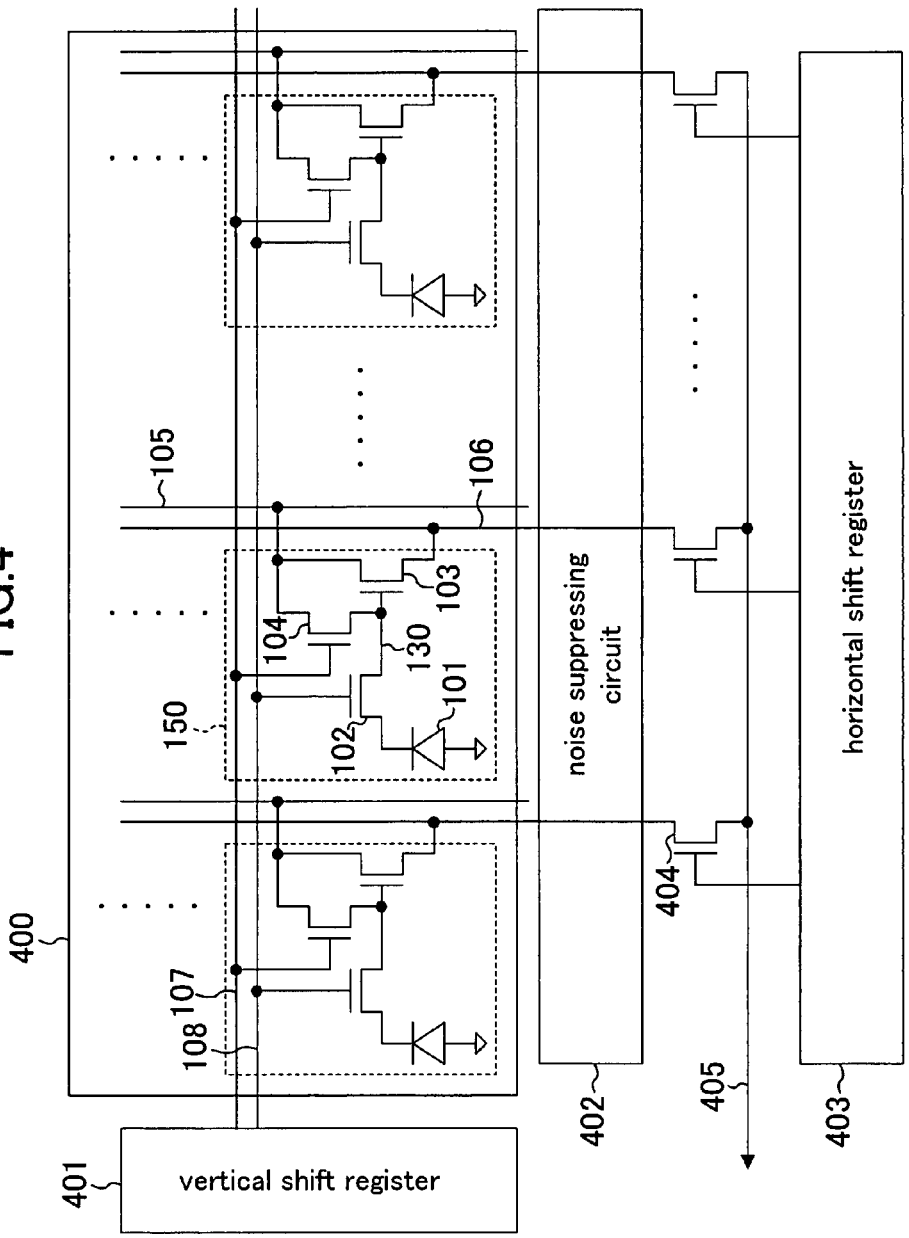
FIG. 4 is a diagram illustrating an outline of a configuration of a pixel array 400 and its surrounding circuits of the solid-state imaging device of this embodiment.

FIG. 4 is a diagram illustrating an outline of a configuration of a pixel array 400 and its surrounding circuits of the solid-state imaging device of this embodiment.

As illustrated in FIG. 4, in the solid-state imaging device of this embodiment, the pixel array 400 includes a large number of cells 150 which are arranged in a matrix (array). The transfer gate wire 108 and the reset gate wire 107 are each connected in common to circuits in cells 150 provided in the same row. The vertical signal 106 is connected in common to circuits in cells 150 provided in the same column. In a portion surrounding the pixel array 400, a vertical shift register 401 for selecting cells 150 belonging to any one row from the pixel array 400 via a corresponding transfer gate wire 108, a noise suppressing circuit (CDS circuit) 402 for removing noise from signals transmitted through the vertical signal lines 106, selection transistors 404 for transferring a signal from the noise suppressing circuit 402 to a horizontal signal line 405, and a horizontal shift register 403 for controlling the selection transistors 404, are provided.

Next, a wire layout of the solid-state imaging device of this embodiment and its feature will be described.

Figure 30:
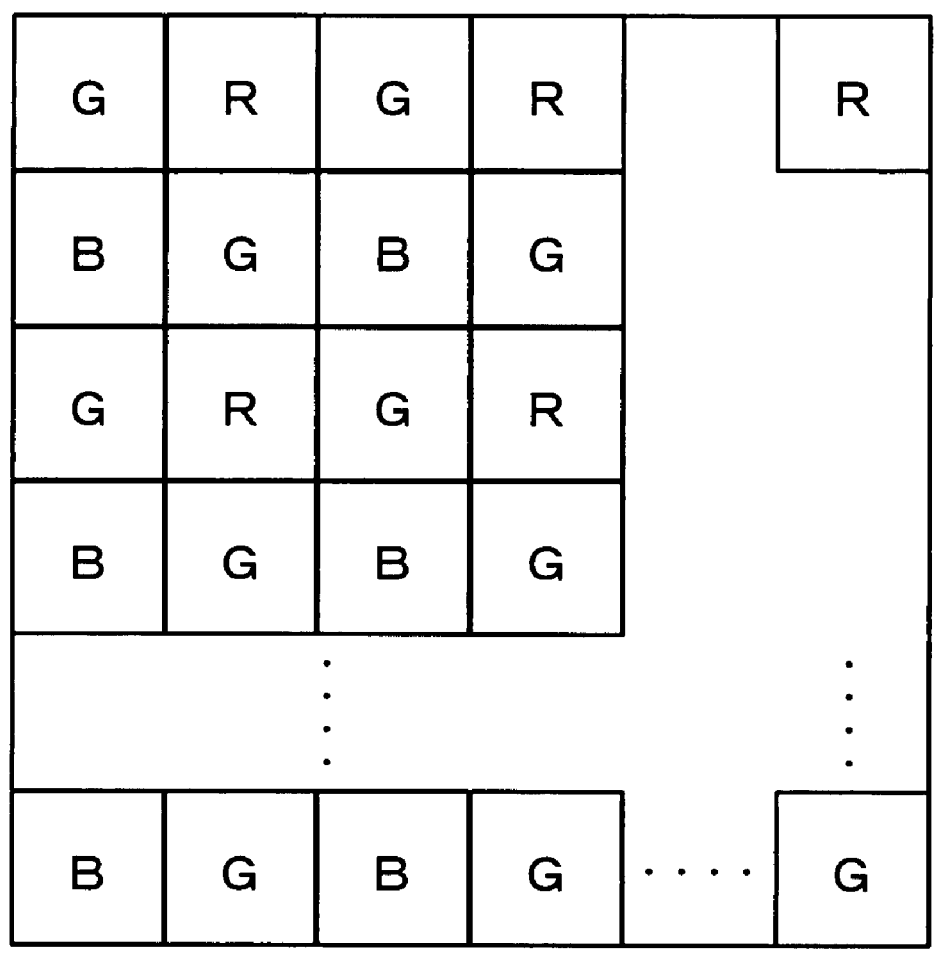
FIG. 30 is a schematic diagram illustrating another exemplary pixel array of a conventional solid-state imaging device.
Figure 31:
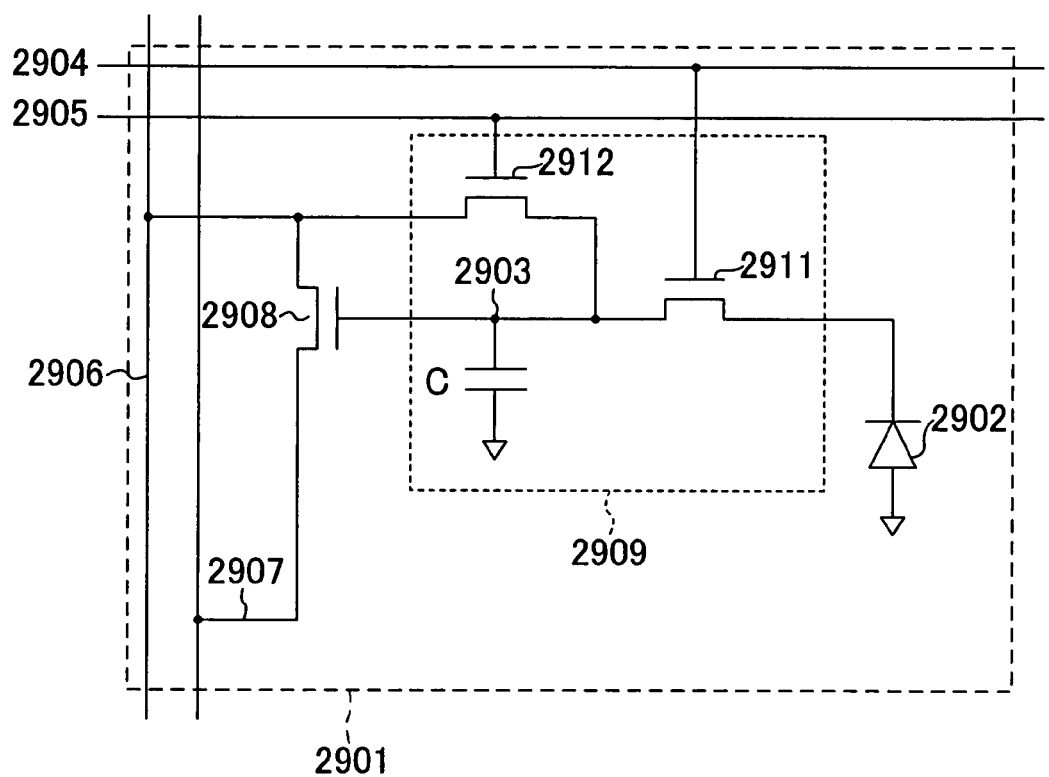
FIG. 31 is a circuit diagram illustrating a cell of a general MOS solid-state imaging device.
Figure 32A:
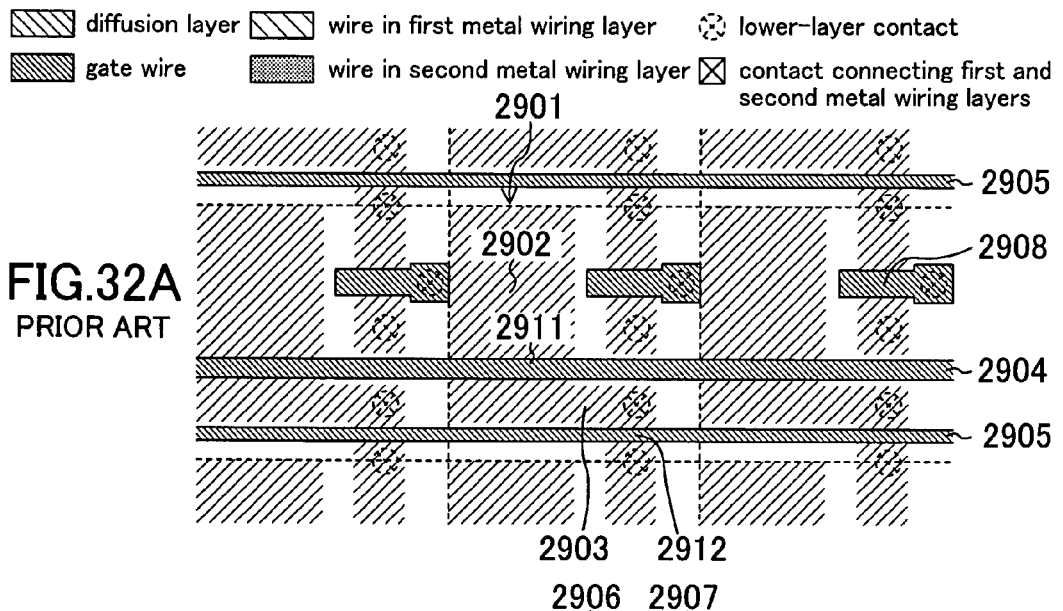
FIGS. 32A to 32C are plan views illustrating an exemplary layout of a conventional pixel array (second conventional example).
Figure 32B:
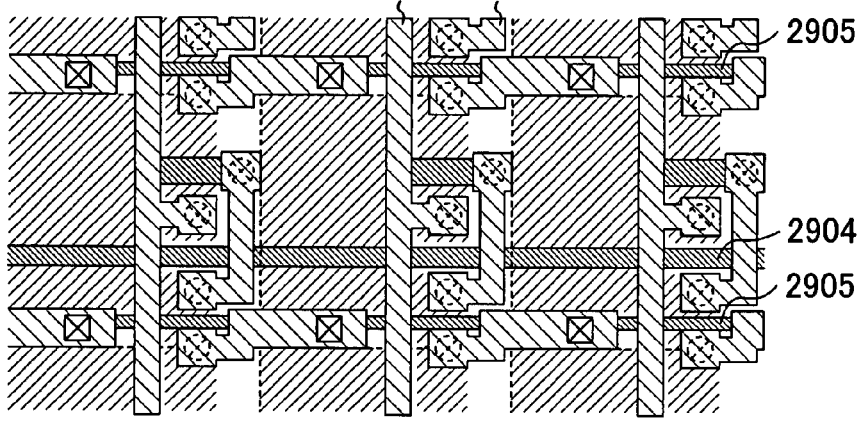
Figure 32C:
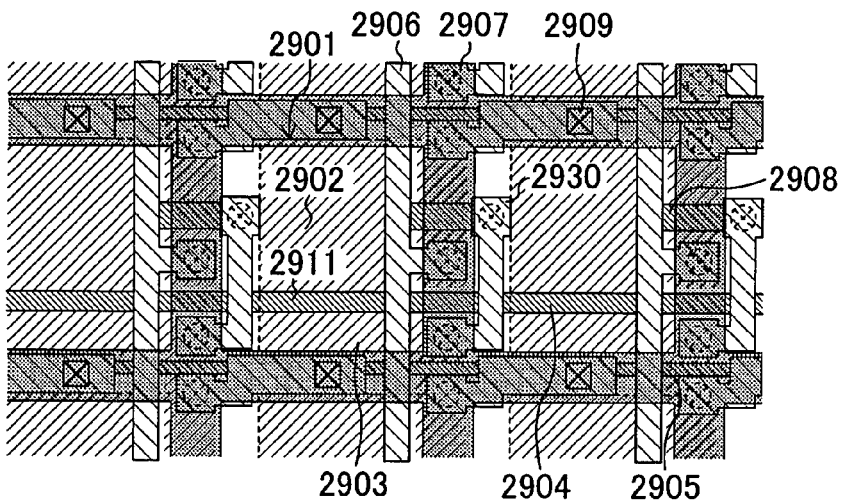
Figure 33:
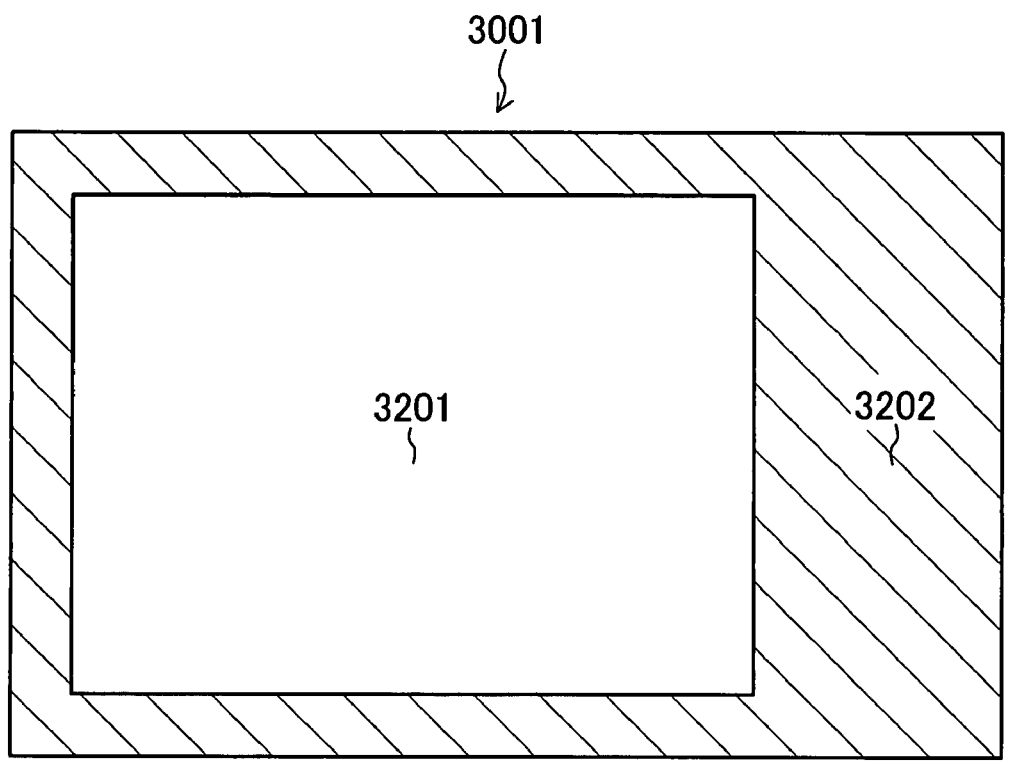
FIG. 33 is a diagram illustrating an exemplary conventional layout of a pixel array (third conventional example).

In the example of FIGS. 1A to 1C and 2, the power supply line 105 and the vertical signal line 106 are formed in the first metal wiring layer, and the substrate contact wire 112 is formed in the second metal wiring layer. The gate wire 109 is formed in the polysilicon wiring layer, and the FD wire 135 is provided in the first metal wiring layer. Color filters of, for example, G (green), R (red) and B (blue) are provided over the metal wiring layer as in the conventional example of FIG. 30. Also, in the pixel array 400, the photodiodes 101 are provided in a matrix.

The vertical signal line 106 (excluding a branch portion 106-1) extends in the column direction, and is provided for each column of cells 150 (and photodiodes 101). The gate wire 109 and the FD wire 135 are formed for each cell 150. In FIGS. 1 and 2, an FD wire in a cell 150 adjacent in the row direction to (on the left side (in FIGS. 1A to 1C) of) the cell 150 in which the gate wire 109 is provided, is indicated as a gate wire 109". Photodiodes in cells 150 both adjacent in the row direction to (both the left and right sides (in FIGS. 1A to 1C) of) the cell 150 in which the photodiode 101 is provided, is indicated as photodiodes 101" and 101'. Also, vertical signal lines both adjacent to the vertical signal line 106 are indicated as vertical signal lines 106" and 106' for the sake of convenience. Note that, when each single photodiode, vertical signal line, or gate wire does not need to be specified, these members are described as the "photodiode 101", the "vertical signal line 106", and the "gate wire 109".

In the pixel array 400, two vertical signal lines 106 and their branch portions 106-1 surround each of photodiodes 101 provided in one column, and two power supply lines 105 which are connected to each other in a ladder-like manner, surround each of photodiodes 101 provided in one column. The columns of photodiodes 101 surrounded by the vertical signal lines 106 and the columns of photodiodes 101 surrounded by the power supply lines 105 are alternately provided.

The reset gate wire 107 and the transfer gate wire 108 are both made of polysilicon, and are provided in the polysilicon wiring layer.

The solid-state imaging device of this embodiment is characterized in that portions provided both adjacent in the row direction to the photodiode 101 of metal wires made of, for example, A1 (e.g., the vertical signal line 106, the power supply line 105, the substrate contact wire 112, the FD wire 135, etc.), the gate wire 109 formed in the polysilicon wiring layer, and the diffusion layer formed on the semiconductor substrate (the source and the drain of the amplifying transistor 103 in FIG. 1) are symmetrical (axisymmetrical) in the row direction (laterally) when viewed from the photodiode 101 provided in each of the cells 150. As used herein, "symmetrical in the row direction when viewed from the photodiode 101" means "axisymmetrical around a center line extending in the column direction of the photodiode 101".

With this configuration, the amount of light entering each photodiode 101 from one side thereof and the amount of light entering from the other side can be caused to be equal to each other. Therefore, the incident characteristics of light entering from both sides of the photodiode 101 can be caused to be substantially equal to each other. Also, with the configuration, the amount and direction of light can be caused to be uniform in each set of a plurality of cells 150, i.e., with the configuration, incident light characteristics can be caused to be uniform in each cell 150. As a result, a variation in light entering each cell 150 can be suppressed, thereby making it possible to suppress the occurrence of shading.

Particularly, in the solid-state imaging device of this embodiment, the vertical signal lines 106, the power supply lines 105, the FD wires 135, and the substrate contact wires 112 are symmetrical in the row direction when viewed from the photodiode 101, except for the branch portions 106-1.

Also, incident light characteristics can be caused to be uniform in each cell 150 since the contacts are arranged to be symmetrical in the row direction when viewed from the photodiode 101.

Further, the FD wires 135 of the amplifying transistor 103 are symmetrical in the row direction when viewed from the photodiode 101. Thereby, a left half and a right half of the photodiode 101 of FIGS. 1A to 1C can be caused to have the same incident light characteristics.

The vertical signal lines 106, the power supply lines 105, and the substrate contact wires 112 are arranged to surround the respective corresponding photodiodes 101. Thereby, light obliquely entering from adjacent cells 150 above and below (in the column direction) and to the left and right (in the row direction) can be reduced, thereby making it possible to prevent the occurrence of a mixed color. Here, the substrate contact wires 112, which function as a light shielding layer, may be arranged in a lattice or the like. Note that the substrate contact wires 112 can be omitted when mixing of colors is tolerated to some extent. In this case, an optical path of light which enters the photodiode 101 in an oblique direction can be secured, so that the sensitivity can be improved. In addition, since the second metal wiring layer is not required, the number of manufacturing steps can be reduced.

Also, since a pair of adjacent power supply lines 105 are formed in the shape of a ladder to seamlessly surround corresponding photodiodes 101, thereby making it possible to prevent light which otherwise enters adjacent cells 150 above and below from leaking into the photodiodes 101.

In contrast to this, the vertical signal lines 106 adjacent to each other cannot be connected together. Therefore, for example, a space 111 is formed between the vertical signal line 106 and the branch portion 106'-1 of the vertical signal line 106' (the vertical signal lines 106 and 106' are adjacent to each other), and a space 110 is formed between the branch portion 106-1 of the vertical signal line 106 and the vertical signal line 106'. A distance between the vertical signal line 106 and the branch portion 106'-1 (a width of the space 111) and a distance between the vertical signal line 106' and the branch portion 106-1 (a width of the space 110) are minimum isolation widths which can be achieved by manufacturing processes. Thereby, light entering adjacent photodiodes 101 above and below (in the column direction) is suppressed from leaking into the interposed photodiode 101, thereby making it possible to cause incident light characteristics of the photodiode 101 surrounded by the vertical signal lines 106 to be close to incident light characteristics of the photodiode 101 surrounded by the power supply lines 105. Also, when the photodiode 101 has a quadrangular planar shape, by arranging the spaces 110 and 111 in the direction of a corner as viewed from the photodiode 101, the influence of light leaking from the vertically adjacent cells 150 can be reduced, thereby making it possible to suppress the occurrence of a mixed color. Also, since the vertical signal lines 106 and 106' each have a branch portion, a variation in parasitic capacitance between a plurality of vertical signal lines can be reduced as compared to when a vertical signal line with a branch portion and a vertical signal line without a branch portion are provided adjacent to each other. Further, for the photodiodes 101 in the cells 150 in each column, the spaces 110 and the spaces 111 are alternately arranged in the column direction, i.e., the space 110 and the space 111 are positioned symmetrical about a center of the photodiode 101, thereby making it possible to cause the photodiodes 101 adjacent in the column direction to each other to have the same incident light characteristics.

Also, portions (the sources and drains of the transfer transistor 102, the amplifying transistor 103, and the reset transistor 104) of the impurity diffusion layer provided on both sides of the photodiode 101 are positioned symmetrical in the row direction when viewed from the photodiode 101. Therefore, distances between impurity diffusion layers (excluding the FD 130, the same is true for the description below) both adjacent in the row direction to a photodiode 101 and the photodiode 101 are equal to each other, and both the impurity diffusion layers have the same shape. Thereby, a stress applied to the photodiode 101 from one of the adjacent impurity diffusion layers and a stress applied to the photodiode 101 from the other adjacent impurity diffusion layer can be caused to be equal to each other. As a result, a right half and a left half of each photodiode 101 can be caused to have substantially the same photoelectric conversion characteristics. Note that the FDs 130 cannot be arranged symmetrical in the row direction when viewed from the photodiode 101. Nevertheless, an in-plane variation in photoelectric conversion characteristics of the photodiode 101 can be significantly suppressed as compared to when the sources and drains of the transfer transistors 102, the amplifying transistors 103, and the reset transistors 104 are not positioned symmetrical when viewed from the photodiode 101.

Also, in the solid-state imaging device of this embodiment, a signal output via the horizontal signal line 405 of FIG. 4 may be processed either by a signal processing circuit (Digital Signal Processor; DSP) provided outside the solid-state imaging device or by a signal processing section provided on the same chip on which the pixel array 400 is provided. Such a signal processing circuit or a signal processing section may correct a variation in a signal between adjacent cells 150 during a process of a signal from the pixel array 400. In this case, the occurrence of shading can be more effectively prevented.

A so-called one-pixel-per-cell type solid-state imaging device in which one photodiode 101 is provided in each cell 150 has been described in this embodiment. Alternatively, the wire layout of this embodiment can be applied to a so-called multiple-pixels-per-cell type solid-state imaging device in which a plurality of photodiodes 101 and a plurality of transfer transistors 102 are provided in each cell 150, thereby making it possible to effectively suppress the occurrence of shading.

For example, a plurality of photodiodes 101, a plurality of transfer transistors for transferring electric charges accumulated in the respective photodiodes 101, one amplifying transistor 103, and one reset transistor 104 may be provided in each cell, i.e., each cell may comprise a plurality of pixels. In the case of a two-pixels-per-cell type solid-state imaging device, the reset transistor 104 and the amplifying transistor 103 are shared by two pixels (photodiodes 101) adjacent to each other in the column direction. In each cell 150, two photodiodes 101 are placed with the reset gate wire 107 and the transfer gate wire 108 being interposed therebetween. In addition, metal wires, such as the vertical signal lines 106, the power supply lines 105, the substrate contact wires 112, and the like, are respectively positioned symmetrical in the row direction when viewed from each photodiode 101. Alternatively, a solid-state imaging device can be manufactured in which three or more pixels (photodiodes) are included in each cell.

In these cases, as compared to the solid-state imaging device of this embodiment, the numbers of the reset transistors 104 and the amplifying transistors 103 formed in the whole pixel array 400 can be reduced, thereby making it possible to reduce the area per pixel and the area of the pixel array 400. Also, the aperture ratio of the photodiode 101 can be easily increased without reducing the pixel area. Note that, in the multiple-pixels-per-cell structure, the area of the FD 130 increases, so that the conversion gain of the FD 130 decreases, and therefore, the sensitivity of the sensor may decrease. Therefore, in some applications in which greater importance is put on performance than on a reduction in area, the solid-state imaging device of this embodiment which can improve sensitivity is more preferably used.

Also, the wire layout of this embodiment can suppress the occurrence of shading even when each cell 150 is configured to further provide a selection transistor between the output portion of the amplifying transistor 103 and the vertical signal line 106.

Although the gate wires 109 of the amplifying transistors 103 both adjacent to the photodiode 101 are formed symmetrical to each other in the row direction when viewed from the photodiode 101 in the wire layout of this embodiment, the gate wires 109 may be placed laterally symmetrical about a center line extending in the column direction of the pixel array (and the photodiode), where the lateral direction is the row direction.

Note that the present invention may be applied to a so-called multiple-pixels-per-cell configuration in which a plurality of pairs of the photodiode 101 and the transfer transistor 102 are provided in each cell 150, or a configuration in which each cell 150 is configured to provide a selection transistor between the output portion (source) of the amplifying transistor 103 and the vertical signal line 106. In these cases, an effect similar to that of the solid-state imaging device of this embodiment can be expected. Although will be described in an embodiment below, in the case of the multiple-pixels-per-cell configuration, at least a plurality of photodiodes 101 and a plurality of transfer transistors 102 may be provided in each cell 150. Although the cells 150 may not be necessarily arranged in a matrix, the photodiodes 101 are preferably arranged in a matrix.

Note that, in the solid-state imaging device of this embodiment, the substrate contact wires 112 are preferably arranged in a lattice as illustrated in FIGS. 1A to 1C, surrounding over each photodiode 101, so as to block light from adjacent cells. In this case, even when the vertical signal line 106 provided in the first metal wiring layer is not provided with the branch portions 106'-1 and 106-1 surrounding the photodiode 101, the occurrence of a mixed color can be suppressed. Similarly, even when the bridge portion connecting two adjacent power supply lines 105 together is not formed, the occurrence of a mixed color can be suppressed.

-Variation of First Embodiment-

Figure 5:
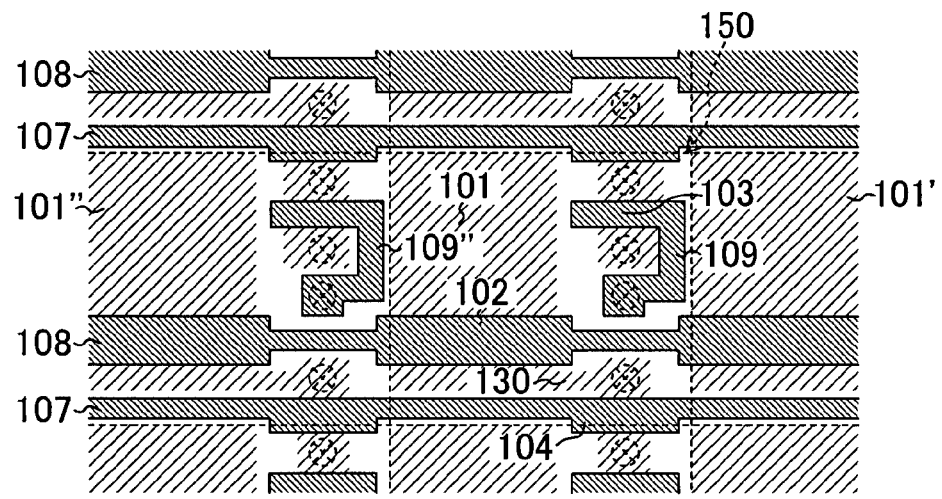
FIG. 5 is a plan view illustrating a layout of a pixel array of a solid-state imaging device according to a first variation of the first embodiment.

FIG. 5 is a plan view illustrating a layout of a pixel array of a solid-state imaging device according to a first variation of the first embodiment. FIG. 5 illustrates contacts (lower-layer contacts) for connecting a diffusion layer, a polysilicon wiring layer, a diffusion layer or a polysilicon wiring layer, which are formed on a semiconductor substrate, and a first metal wiring layer.

In the solid-state imaging device of this variation, in each cell 150, portions (gate wires) formed in the polysilicon wiring layer of the gate wires 109 and 109" provided both adjacent in the row direction to the photodiode 101 have the same shape and orientation. The portion provided in the polysilicon wiring layer of the gate wire 109 has a shape which has less influence on incident light characteristics as compared to the shapes of the vertical signal line 106 and the power supply line 105, and therefore, the portions may not be necessarily positioned symmetrical in the row direction when viewed from the photodiode 101. With this configuration, the cells 150 in the pixel array 400 can be caused to have the same sensitivity of the photodiode 101.

Figure 6:
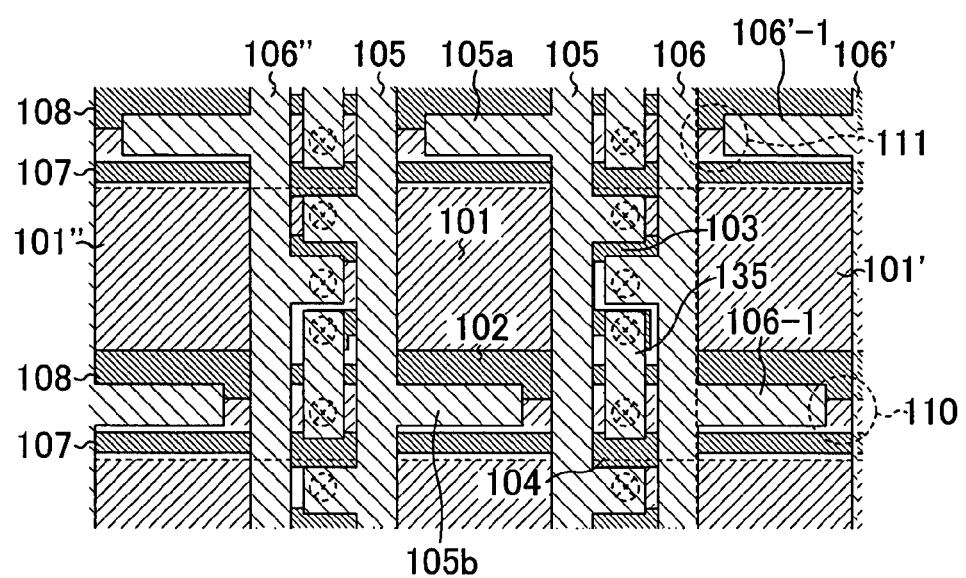
FIG. 6 is a plan view illustrating a layout of a pixel array of a solid-state imaging device according to a second variation of the first embodiment.

FIG. 6 is a plan view illustrating a layout of a pixel array of a solid-state imaging device according to a second variation of the first embodiment. Although the photodiode 101 is surrounded by the ladder-shaped power supply line 105 in the solid-state imaging device of the first embodiment of FIGS. 1A to 1C, the connection portion of the two power supply lines 105 may be cut so that a space having a minimum width which is achieved by manufacturing processes may be formed in the vicinity of a corner when viewed from the photodiode 101 as in this variation. Thereby, aperture patterns on the photodiodes 101 in all cells are the same, resulting in the uniform sensitivity of the photodiodes 101. In this case, two adjacent power supply lines 105 may be provided with branch portions 105a and 105b, respectively, and the branch portions 105a and 105b may be alternately placed, thereby making it possible to cause parasitic capacitance occurring in the power supply line 105 to be uniform.

Figure 7:
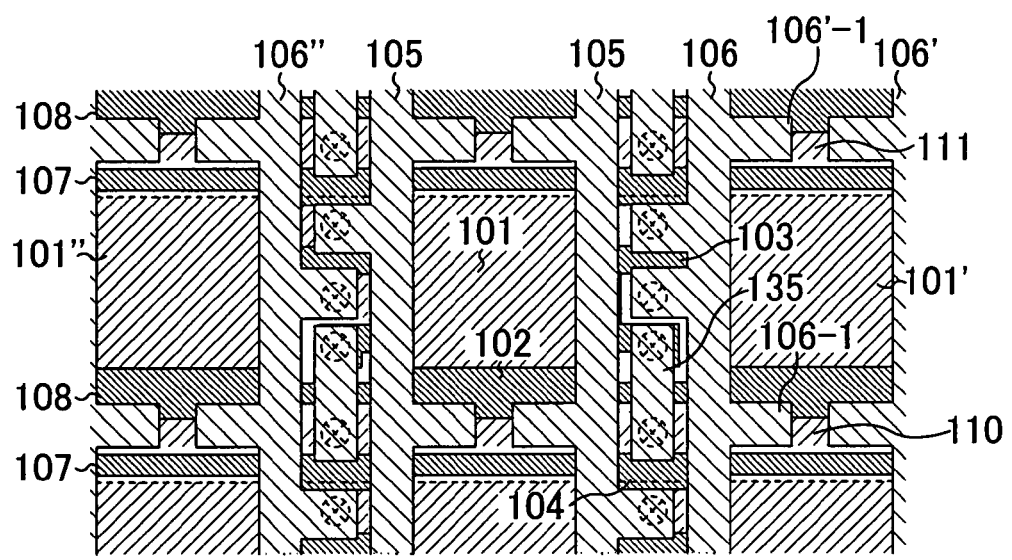
FIG. 7 is a plan view illustrating a layout of a pixel array of a solid-state imaging device according to a third variation of the first embodiment.

FIG. 7 is a plan view illustrating a layout of a pixel array of a solid-state imaging device according to a third variation of the first embodiment. In the solid-state imaging device of this variation, the spaces 110 and 111 of the vertical signal lines 106 and 106' adjacent to each other are formed on portions overlapping a center line extending in the column direction of the photodiode 101 when viewed from the top. Also, in the connection portion of two power supply lines 105 adjacent to each other, a space is formed at a position overlapping the center line extending in the column direction of the photodiode 101. Thereby, the aperture patterns over all of the photodiodes 101 can be caused to be the same, resulting in the uniform sensitivity of the photodiodes 101. Also, a portion positioned in the column direction (vertical direction in FIG. 7) as viewed from the photodiode 101 of each of the power supply line 105 and the vertical signal line 106, is symmetrical in the row direction. Thereby, an upper half and a lower half of the photodiode 101 can caused to have the same incident light characteristics.

Figure 8A:
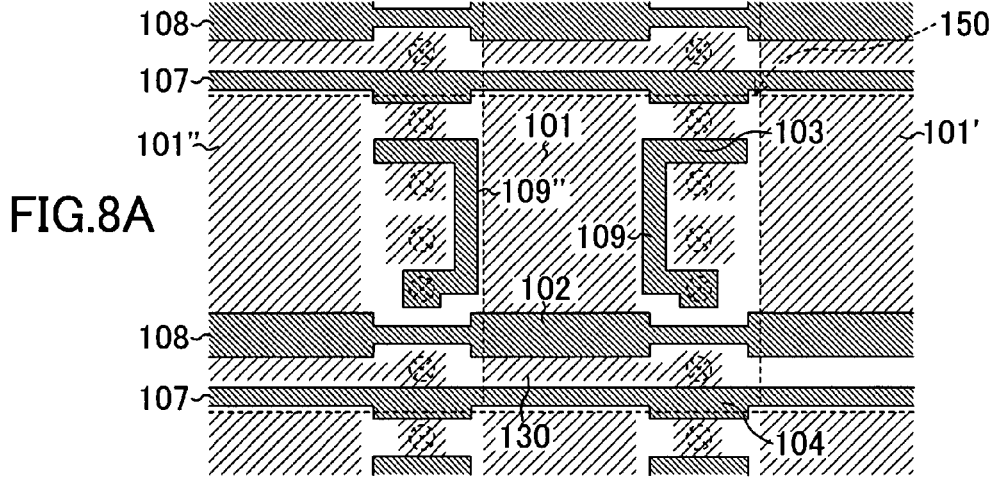
FIGS. 8A to 8C are plan views illustrating a layout of a pixel array of a solid-state imaging device according to a fourth variation of the first embodiment.
Figure 8B:
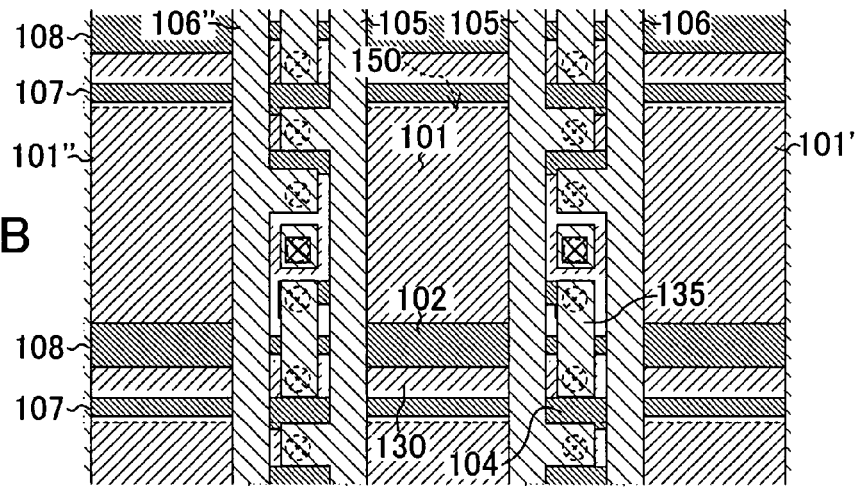
Figure 8C:
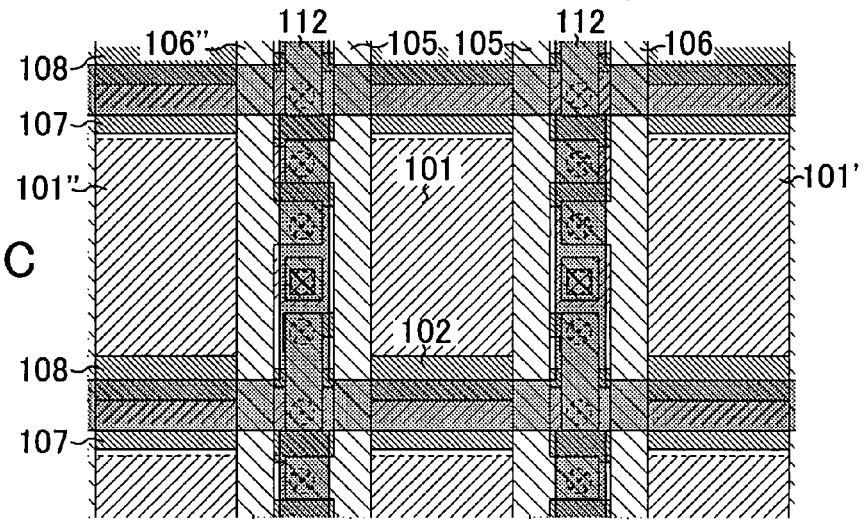

FIGS. 8A to 8C are plan views illustrating a layout of a pixel array of a solid-state imaging device according to a fourth variation of the first embodiment. FIG. 8A illustrates a diffusion layer, a polysilicon wiring layer, and lower-layer contacts formed on a semiconductor substrate in the pixel array. FIG. 8B illustrates wires in a first metal wiring layer, and contacts connecting the first metal wiring layer and a second metal wiring layer in addition to the configuration of FIG. 8A. FIG. 8C illustrates wires formed in the second metal wiring layer in addition to the configuration of FIG. 8B.

In the solid-state imaging device of this variation, p-type wells are formed in an n-type semiconductor substrate, and cells 150 are formed in the p-type wells. To reduce the resistance of the p-type well, a substrate contact region is provided in the p-type well for each cell 150, and the substrate contact region is connected via the contact to a substrate contact wire 112 formed in the second metal wiring layer. Also, as illustrated in FIG. 8A, gate wires 109 and 109" are significantly extended so as to detour the substrate contact region as compared to the gate wires 109 and 109" of FIG. 1A.

The substrate contact region is provided so as to reduce the resistance between the p-type well and the contact. When an n-type semiconductor substrate is used, electric charges obtained by photoelectric conversion are unlikely to be mixed in each cell 150, thereby making it possible to suppress the occurrence of a mixed color, as compared to when a p-type semiconductor substrate is used. Also, by providing the substrate contact region for each cell 150, the substrate potential of the transistor can be stabilized, resulting in an improvement in the response speed of the transistor. Therefore, the solid-state imaging device of this variation is suitably used when importance is put on reproducibility of colors (less mixing of colors), when the number of pixels is large (i.e., the scale of a pixel array is large), or for single-lens reflex cameras, HD (High Definition) camcorders or the like, which require a large frame rate. Note that, when a p-type semiconductor substrate is used, the substrate contact wire 112 is connected via a contact to the p-type semiconductor substrate.

Note that, in the solid-state imaging device of this variation, the substrate contact wires 112 are preferably arranged in a lattice, surrounding over each photodiode 101, so as to block light from adjacent cells. In this case, as illustrated in FIGS. 8A to 8C, even when the power supply line 105 and the vertical signal line 106 provided in the first metal wiring layer are not provided with branch portions surrounding the photodiode 101, the occurrence of a mixed color can be suppressed. Also, the substrate contact regions and the contacts which are adjacent to both sides of each photodiode 101 are preferably formed and positioned symmetrical in the row direction when viewed from the photodiode 101.

Figure 29:
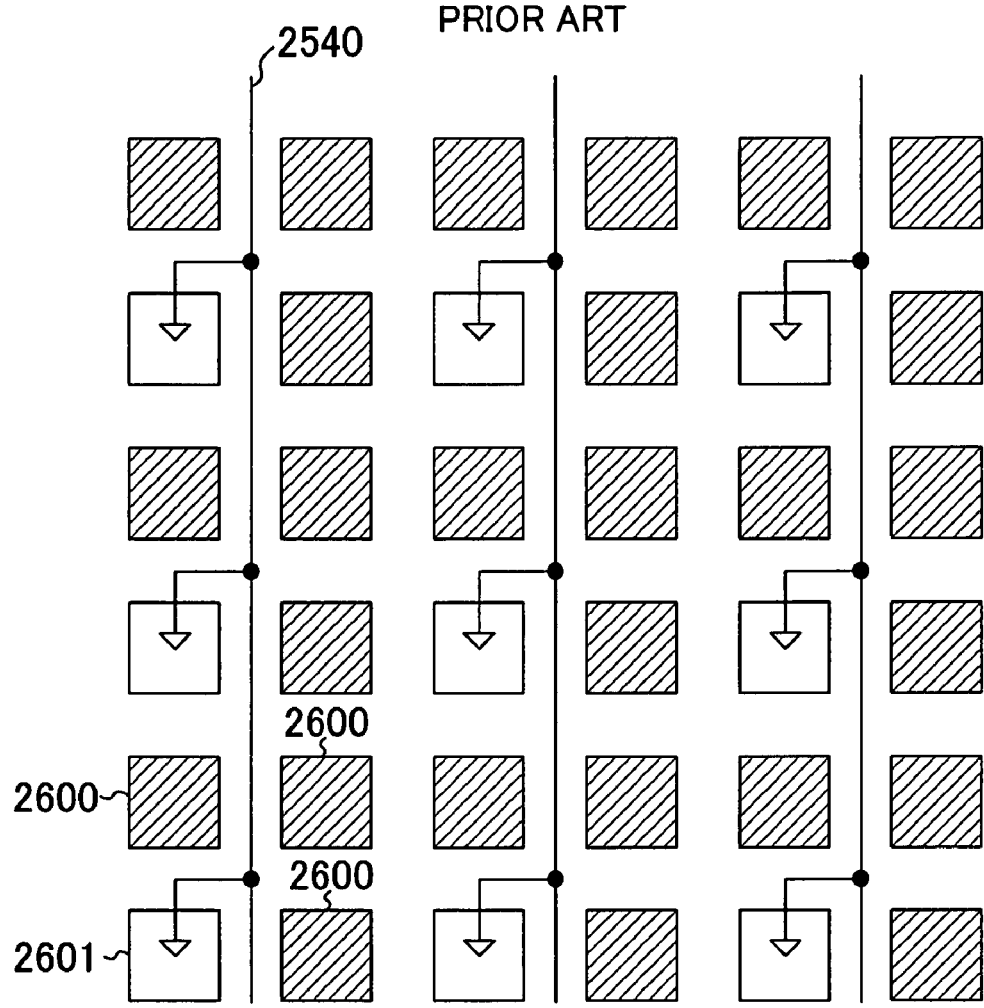
FIG. 29 is a diagram illustrating an outline of the pixel array of the conventional solid-state imaging device.

Note that, as in the conventional example of FIG. 29, a pixel array used for substrate contacts may be provided, and the substrate contact wire 112 may be connected to a substrate contact region formed in the pixel array.

Second Embodiment

FIGS. 9A to 9C are plan views illustrating a layout of a pixel array of a solid-state imaging device according to a second embodiment of the present invention. FIG. 9A illustrates a polysilicon wiring layer, and contacts connecting a diffusion layer or polysilicon wires formed on a semiconductor substrate and wires formed in a first metal wiring layer, in a pixel array. FIG. 9B illustrates the wires formed in the first metal wiring layer, and contacts (vias) connecting the first metal wiring layer and a second metal wiring layer in addition to the configuration of FIG. 9A. FIG. 9C illustrates wires formed in the second metal wiring layer in addition to the configuration of FIG. 9B. FIG. 10 is a cross-sectional view of the solid-state imaging device of the second embodiment, taken along line X-X of FIGS. 9A to 9C.

The solid-state imaging device of this embodiment is different from the solid-state imaging device of the first embodiment in a portion of the wire layout. Specifically, in the solid-state imaging device of this embodiment, each cell 250 comprises: a photodiode 201; an FD 230; a transfer transistor 202 having a gate electrode connected to a transfer gate wire 208; a reset transistor 204 having a gate electrode connected to a reset gate wire 207; an amplifying transistor 203; a gate wire 209 of the amplifying transistor 203; an FD wire 235; and a substrate contact wire 212. The circuit configuration of the pixel array 500 and the function of each constituent part are basically the same as those of the solid-state imaging device of the first embodiment and will not be described. Note that, in FIGS. 9A to 9C and 10, an FD wire in a cell 250 adjacent in the row direction to (on the left side (FIGS. 9A to 9C) of) a cell 250 in which the gate wire 209 is provided, is indicated as a gate wire 209". Photodiodes in cells 250 both adjacent in the row direction to (on both the left and right sides (FIGS. 9A to 9C) of) a cell 250 in which the photodiode 201 is provided, are indicated as photodiodes 201" and 201'. Also, vertical signal lines both provided adjacent to the vertical signal line 106 are indicated as vertical signal line 206" and 206' for the sake of convenience.

The solid-state imaging device of this embodiment is characterized in that a substrate contact region is formed in a p-type well for each cell 250, power supply lines 205 and the substrate contact wires 212 are provided in the first metal wiring layer, and vertical signal lines 206 are provided in the second metal wiring layer. Also, since the substrate contact region is formed, the gate wire 209 is significantly extended as in the example of FIG. 8A, as compared to the solid-state imaging device of the first embodiment of FIGS. 1A to 1C.

Two power supply lines 205 provided adjacent to each other are connected to each other in the shape of a ladder, surrounding over each photodiode 201 belonging to one column. Also, two substrate contact wires 212 provided adjacent to each other are connected to each other in the shape of a ladder, surrounding over each photodiode 201 belonging to one column. The columns of photodiodes 201 surrounded by the power supply lines 205 and the columns of photodiodes 201 surrounded by the substrate contact wires 212 are alternately provided. Each pair of the vertical signal lines 206 provided in the second metal wiring layer is provided, surrounding over the photodiodes 201 in the corresponding column. However, since the vertical signal lines 206 cannot be connected to each other, a space having a minimum width which can be achieved by manufacturing processes is formed between the vertical signal lines 206 adjacent to each other. In the example of FIGS. 9A to 9C, the space is provided on a center line extending in the column direction of the photodiode 201.

In the solid-state imaging device of this embodiment, since the substrate contact wire 212 which is connected to the substrate contact region provided in each cell 250 is provided as in the solid-state imaging device of FIG. 8, it is possible to stabilize the substrate potential of the transistor provided in the pixel array 500, and improve the response speed of the transistor.

Also, the vertical signal lines 206 provided in the second metal wiring layer surround over each photodiode 201, thereby suppressing light from entering from adjacent cells 250. Since there is a gap formed between adjacent vertical signal lines 206, light shielding is not complete. To compensate for this, the power supply lines 205 and the substrate contact wires 212 surround over the photodiodes 201 without a gap. Thereby, light shielding is more reliably achieved, thereby making it possible to more reliably prevent the occurrence of a mixed color. Also, the incident light characteristics of each photodiode 201 are uniform, so that the photodiode 201 has uniform characteristics. Note that, when mixing of colors is tolerated to some extent, the power supply line 205 and the substrate contact wire 212 may each have a linear shape.

Further, since the vertical signal line 206 is provided in the second metal wiring layer, a capacitance between the vertical signal line 206 and the FD wire 135 can be reduced as compared to when the vertical signal line 206 is provided in the first metal wiring layer. Therefore, a variation in parasitic capacitance in each cell 250 can be suppressed, thereby making it possible to more effectively suppress the occurrence of shading.

Note that the substrate contact regions provided on both sides of the photodiode 201 are preferably positioned symmetrical in the row direction when viewed from the photodiode 201. In this case, a stress applied to the photodiode 201 from the left direction of FIGS. 9A to 9C and a stress applied to the photodiode 201 from the right direction can be caused to be substantially equal to each other, thereby making it possible to cause the in-plane photoelectric conversion characteristics of the photodiode 201 to be uniform.

Although the substrate contact region and the substrate contact wire 212 are provided in the solid-state imaging device of this embodiment, the above-described substrate contact wire 212 may not be provided.

Also, in the solid-state imaging device of this embodiment, a light-shielded pixel region (so-called OB region) over the entirety of which is covered with a light shielding layer made of a metal may be provided in the pixel array 500. In this case, in the light-shielded pixel region, the power supply line 205 may be provided in the second metal wiring layer, and the vertical signal line 206 may be provided in the first metal wiring layer. Also, in this case, it is preferable to provide a wiring layer changing region for changing wiring layers in which a wire is provided, between the light-shielded pixel region and the region (effective pixel region) having the configuration of FIGS. 9A to 9C.

Third Embodiment

Figure 11A:
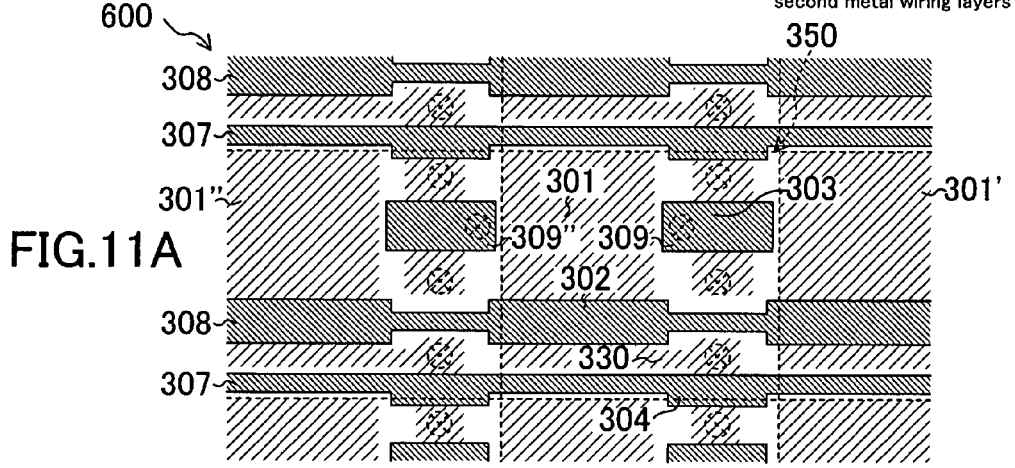
FIGS. 11A to 11C are plan views illustrating a layout of a pixel array of a solid-state imaging device according to a third embodiment of the present invention.
Figure 11B:
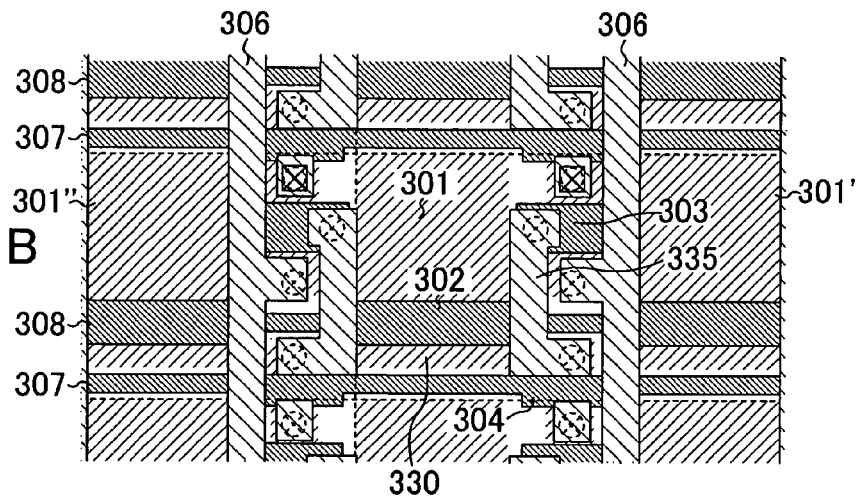
Figure 11C:
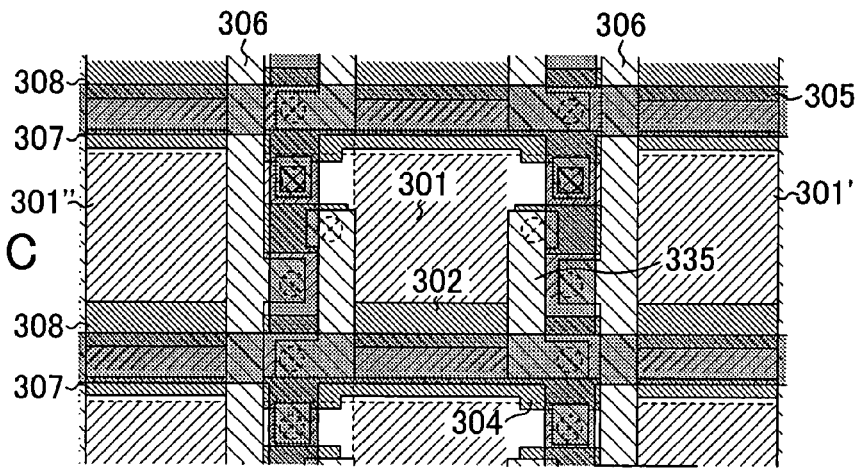

FIGS. 11A to 11C are plan views illustrating a layout of a pixel array of a solid-state imaging device according to a third embodiment of the present invention. FIG. 11A illustrates a polysilicon wiring layer, and contacts connecting a diffusion layer or polysilicon wires formed on a semiconductor substrate and wires in a first metal wiring layer, in the pixel array. FIG. 11B illustrates wires formed in the first metal wiring layer, and contacts connecting the first metal wiring layer and a second metal wiring layer, in addition to the configuration of FIG. 11A. FIG. 11C further illustrates wires formed in the second metal wiring layer in addition to the configuration of FIG. 11B.

The solid-state imaging device of this embodiment is different from the solid-state imaging devices of the first and second embodiments in a portion of the wire layout. Specifically, in the solid-state imaging device of this embodiment, each cell 350 comprises: a photodiode 301; an FD 330; a transfer transistor 302 having a gate electrode connected to a transfer gate wire 308; a reset transistor 304 having a gate electrode connected to a reset gate wire 307; an amplifying transistor 303; a gate wire 309 of the amplifying transistor 303; and an FD wire 335. The circuit configuration of the pixel array 600 and the function of each constituent part are basically the same as those of the solid-state imaging device of the first embodiment and will not be described.

The solid-state imaging device of this embodiment is characterized in that the gate wires 309 do not detour the contacts, the FD wires 335 formed in the first metal wiring layer are extended to detour the contacts, vertical signal lines 306 are provided in the first metal wiring layer, and power supply lines 305 are provided in the second metal wiring layer. The power supply lines 305 are arranged in, for example, a lattice, and function as a light shielding layer which surrounds over the photodiode 301 in each cell 350. Also, substrate contact wires are not formed on the pixel array 600.

In the solid-state imaging device of this embodiment, the adjacent gate wires on both sides of the photodiode 301 are positioned symmetrical in the row direction when viewed from the photodiode 301. The adjacent vertical signal lines 306 and the adjacent FD wires 335 on both sides of the photodiode 301 are also positioned symmetrical in the row direction when viewed from the photodiode 301. Thereby, a variation in incident light characteristics of each photodiode 301 can be suppressed.

Also, the power supply lines 305 are arranged in a lattice, surrounding over each photodiode 301, thereby functioning as a light shielding layer. Therefore, the vertical signal lines 306 do not necessarily need to surround over the photodiodes 301. As illustrated in FIGS. 11A to 11C, when the solid-state imaging device needs to be miniaturized no matter that the occurrence of a mixed color is tolerated to some extent, the vertical signal line 306 may be formed in a linear shape.

Thus, the solid-state imaging device of this embodiment can be miniaturized while suppressing mixing of colors and the occurrence of shading.

Fourth Embodiment

Figure 12:
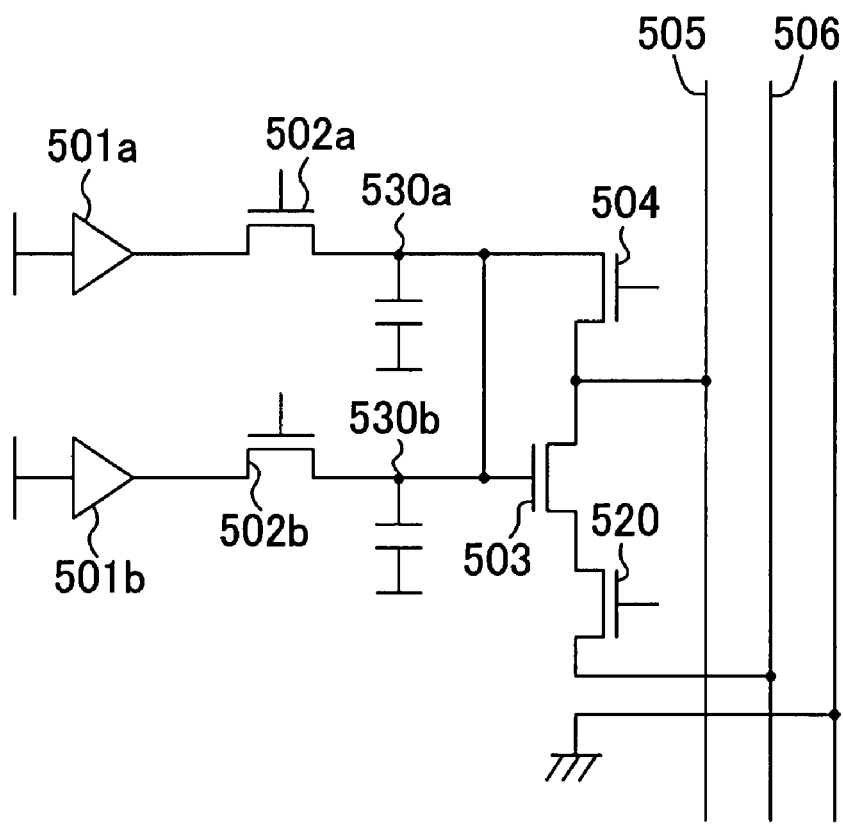
FIG. 12 is a circuit diagram illustrating a portion of a pixel array of a solid-state imaging device according to a fourth embodiment of the present invention.

FIG. 12 is a circuit diagram illustrating a portion of a pixel array of a solid-state imaging device according to a fourth embodiment of the present invention. In this embodiment, a solid-state imaging device in which two pixels (i.e., two photodiodes) are included per cell will be described as an example of a so-called multiple-pixels-per-cell type solid-state imaging device.

As illustrated in FIG. 12, in the solid-state imaging device of this embodiment, each cell comprises: a first photodiode 501*a* and a second photodiode 501*b* which accumulate an amount of electric charges corresponding to the intensity of received light; a first FD 530*a* and a second FD 530*b* to which electric charges accumulated by the first photodiode 501*a* and the second photodiode 501*b* are transferred, respectively; a first transfer transistor 502*a* which is controlled by a first transfer gate wire 508*a* (see FIG. 13) to control transfer of electric charges from the first photodiode 501*a* to the first FD 530*a*; a second transfer transistor 502*b* which is controlled by a second transfer gate wire 508*b* (see FIG. 13) to control transfer of electric charges from the second photodiode 501*b* to the second FD 530*b*; a reset transistor 504 which is controlled by a reset gate wire 507 (see FIG. 13) to initialize the potentials of the first FD 530a and the second FD 530b; an amplifying transistor 503 which has a gate electrode connected to the first FD 530a and the second FD 530b, a drain to a power supply line 505, and a source connected to a vertical signal line 506 to form a source follower; a selection transistor 520 which is provided between the source of the amplifying transistor 503 and the vertical signal line 506 to transfer an output signal of the amplifying transistor 503 to the vertical signal line 506; and a substrate contact wire 512 (see FIG. 13) which is connected to a substrate contact region including a p-type impurity formed on a substrate. At least one substrate contact region is formed in each cell.

In the solid-state imaging device of this embodiment, two pairs of a photodiode and a transfer transistor connected thereto are formed in each cell. Note that three pairs of a photodiode and a transfer transistor connected thereto may be formed in each cell. Although the first FD 530a and the second FD 530b are provided in each cell, one FD may be shared by a plurality of photodiodes in each cell. Also, the reset transistor 504, the amplifying transistor 503, the selection transistor 520 or the like can be shared by a plurality of photodiodes. Note that, in the pixel array of this embodiment, a plurality of cells are arranged in a matrix, and a plurality of photodiodes are also arranged in a matrix.

Figure 13A:
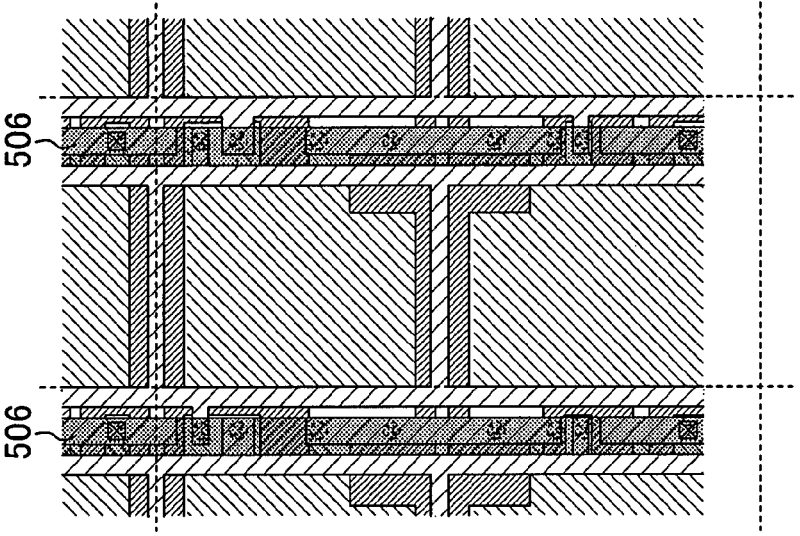
FIGS. 13A to 13C are plan views illustrating a layout of an effective pixel region of a solid-state imaging device according to the fourth embodiment.
Figure 13B:
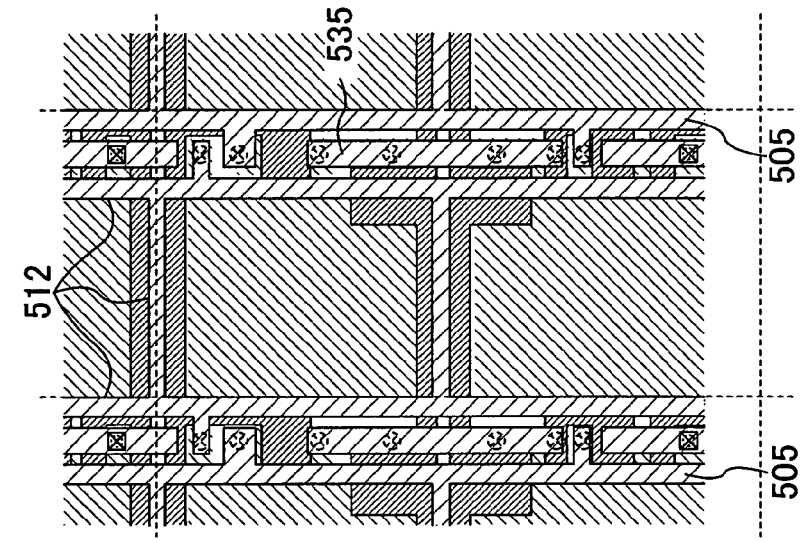
Figure 13C:
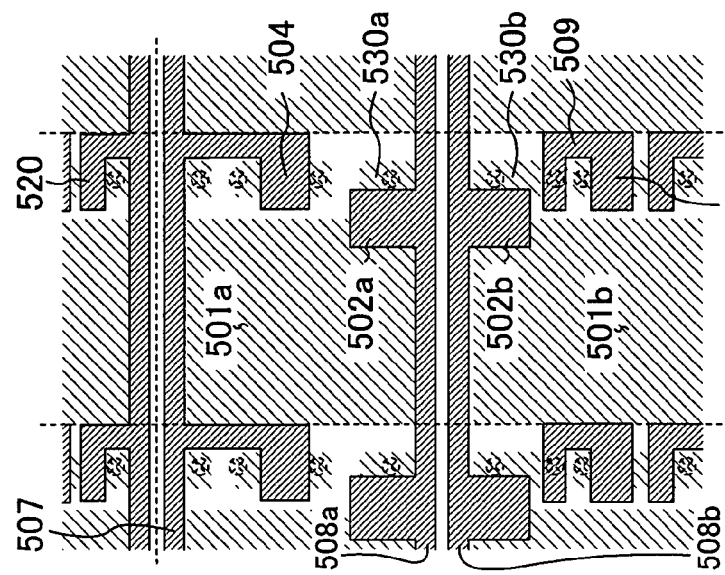

FIGS. 13A to 13C are plan views illustrating a layout of an effective pixel region of a solid-state imaging device according to the fourth embodiment. FIG. 13A illustrates a polysilicon wiring layer, and contacts connecting a diffusion layer or polysilicon wires formed on a semiconductor substrate and a first metal wiring layer, in the pixel array. FIG. 13B illustrates wires formed in the first metal wiring layer, and contacts connecting the first metal wiring layer and a second metal wiring layer, in addition to the configuration of FIG. 13A. FIG. 13C further illustrates wires formed in a second metal wiring layer in addition to the configuration of FIG. 13B. Note that dashed lines indicates boundaries of cells in FIGS. 13A to 13C. Although FIGS. 13A to 13C illustrate a portion of the pixel array, a configuration similar that of FIGS. 13A to 13C is actually repeated both in the row direction and in the column direction.

In the solid-state imaging device of this embodiment, since two photodiodes (the first photodiode 501a and the second photodiode 501b) are provided in each cell, the proportion of the area of the photodiodes with respect to the unit area of an imaging region (pixel array) can be increased. Therefore, the sensitivity and saturation characteristics of the photodiode can be improved.

In the solid-state imaging device of this embodiment, FD wires 535 and the power supply lines 505 are provided in the first metal wiring layer over the pixel array. The vertical signal lines 506 are provided in the second metal wiring layer formed over the first metal wiring layer. Therefore, even when oblique incident light characteristics are improved by shifting a position of the vertical signal line 506, depending on a distance from a center line of the pixel array, a variation in parasitic capacitance occurring in each cell is suppressed, thereby making it possible to suppress the occurrence of shading.

Also, in the solid-state imaging device of this embodiment, when attention is paid to one photodiode, portions both adjacent in the row direction to (on the left and right side (in FIGS. 13A to 13C) of) the photodiode of the metal wire provided in the first metal wiring layer or the second metal wiring layer are laterally symmetrical when viewed from the photodiode. With this configuration, light entering from the left side and light entering from the right side are equal to each other in each photodiode, so that a variation in in-plane sensitivity of the photodiode is suppressed, thereby making it possible to effectively suppress the occurrence of shading. Although the gate wires of the reset transistors 504 may have the same shape in the cells as illustrated in FIG. 13A, the gate wires adjacent in the row direction to the photodiode may be positioned symmetrical in the row direction when viewed from the photodiode.

Also, each pair of the power supply lines 506 provided in the first metal wiring layer is in the shape of a ladder, surrounding over photodiodes provided in a corresponding column. As is similar to the power supply lines 506, each pair of the substrate contact wires 512 provided in the first metal wiring layer is in the shape of a ladder, surrounding over photodiodes provided in a corresponding column. On the other hand, the vertical signal lines 506 provided in the second metal wiring layer are provided for the respective columns of photodiodes (or cells), extending in a straight line. With this configuration, of light collected by a microlens provided over photodiode for the purpose of increasing the efficiency of light collection, light which should reach the photodiode is less blocked by a wire provided in the uppermost metal wiring layer (here, the second metal wiring layer). Therefore, the sensitivity and saturation characteristics of the photodiode can be improved as compared to when the vertical signal lines 506 provided in the uppermost metal wiring layer surround over the photodiodes. Note that, in the solid-state imaging device of this embodiment, the columns of the photodiodes surrounded by the power supply lines 506 and the columns of the photodiode surrounded by the substrate contact wires 512 are alternately provided.

Also, in the solid-state imaging device of this embodiment, the substrate contact region is formed for each cell on the substrate on which the pixel array is provided. Therefore, the operation of the transistor formed in the pixel array can be stabilized, and the read speed of a signal can be improved.

Also, the power supply line 505 which supplies pulses of a power supply voltage is connected to the drain of the reset transistor 504 and functions as a reset power supply, so that the wire layout is simple and the aperture area of the photodiode can be increased.

Also, in the solid-state imaging device of this embodiment, as illustrated in FIG. 13C, the power supply line 505 and the vertical signal line 506 are positioned substantially parallel to each other, with an interlayer insulating film being interposed therebetween. Further, the power supply line 505 and the vertical signal line 506 are provided, avoiding overlapping each other to the extent possible, when viewed from the top. With this configuration, the signal transmitted through the vertical signal line 506 is less affected by noise from the power supply line 505.

Also, the FD wire 535 connecting the FD and the gate electrode of the amplifying transistor 503 is positioned substantially parallel to the power supply line 505. With this configuration, electric charges accumulated in the FD wire 535 are less affected by noise from the power supply line 505.

Fifth Embodiment

-Circuit Configuration-

Figure 14:
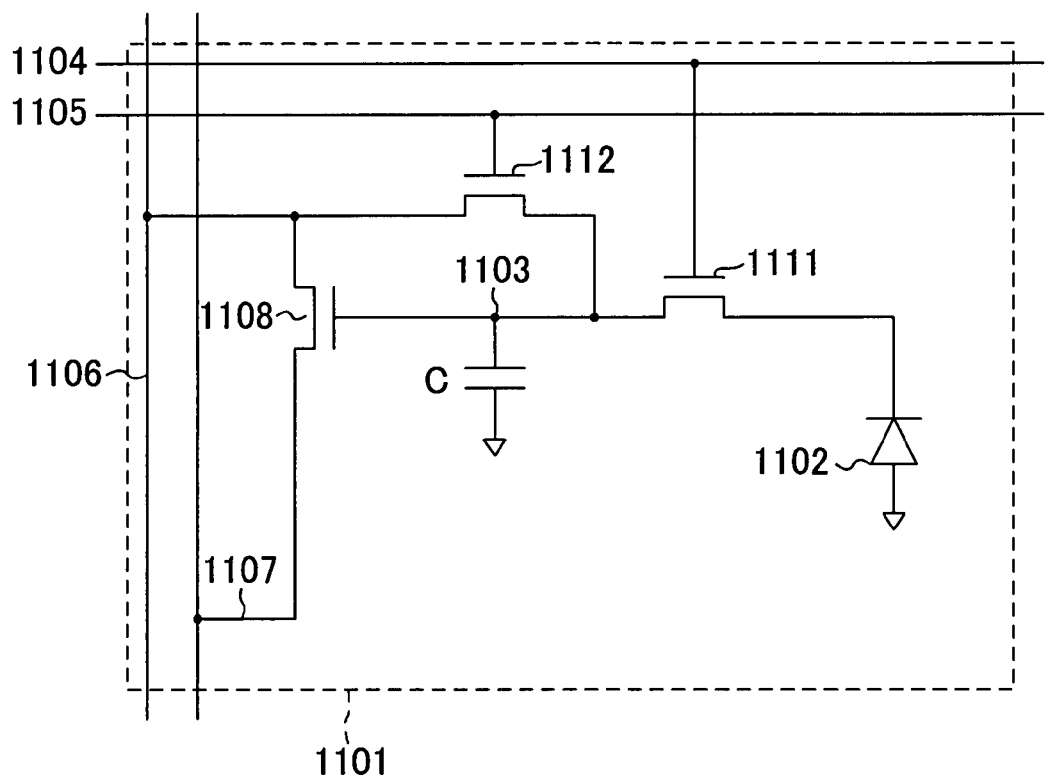
FIG. 14 is a circuit diagram illustrating a cell of a MOS solid-state imaging device according to a fifth embodiment of the present invention.

FIG. 14 is a circuit diagram illustrating a cell of a MOS solid-state imaging device according to a fifth embodiment of the present invention. When one photodiode is provided in each cell as in the solid-state imaging device of this embodiment, the cell is also generally called a "pixel cell".

As illustrated in FIG. 14, in the solid-state imaging device of this embodiment, a cell 1101 comprises: a photodiode 1102 which accumulates an amount of electric charges corresponding to the intensity of received light; an FD 1103 to which electric charges accumulated by the photodiode 1102 are transferred; a transfer transistor 1111 which is controlled by a transfer gate wire 1104 to control transfer of electric charges from the photodiode 1102 to the FD 1103; a capacitance including a wire capacitance and the like connected to the FD 1103; a reset transistor 1112 which is controlled by the reset gate wire 1105 to initialize the potential of the FD 1103; and an amplifying transistor 1108 which has a gate electrode connected to the FD 1103, a drain connected to the power supply line 1106, and a source connected to the vertical signal line 1107 to form a source follower. In FIG. 14, the FD 1103 is indicated as a node between the drain of the transfer transistor 1111 and the gate electrode of the amplifying transistor 1108. One photodiode 1102, one transfer transistor 1111, one reset transistor 1112, and one amplifying transistor 1108 are provided in each cell 1101.

Figure 15:
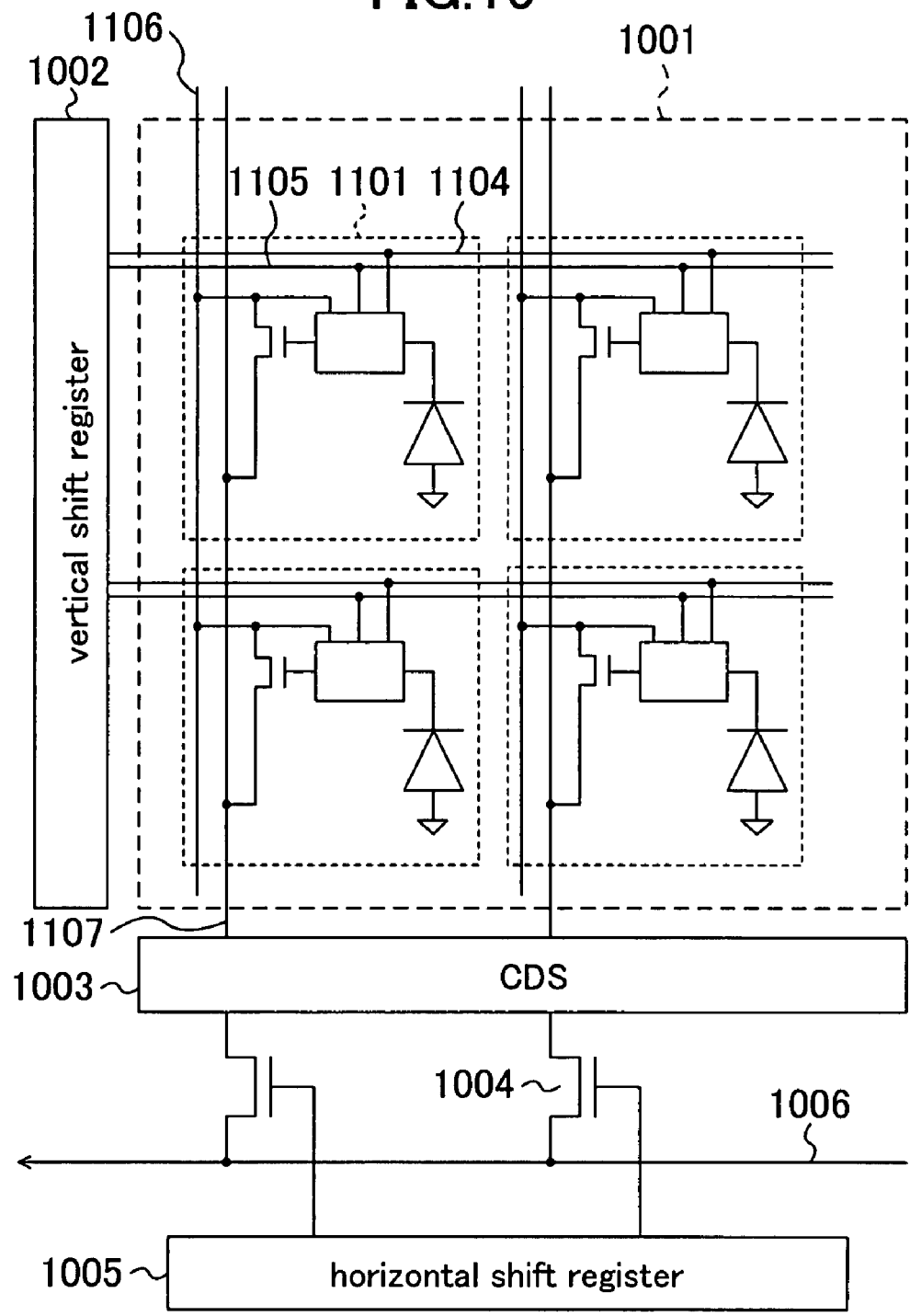
FIG. 15 is a diagram illustrating an outline of a circuit diagram of the solid-state imaging device of the fifth embodiment.

FIG. 15 is a diagram illustrating an outline of a circuit diagram of the solid-state imaging device of the fifth embodiment.

As illustrated in FIG. 15, the solid-state imaging device of this embodiment comprises: a pixel array 1001 which has a number of cells 1101 arranged in a matrix; transfer gate wires 1104 and reset gate wires 1105 which extend in the row direction (horizontal direction), and each of which is connected in common to circuits of cells 1101 provided in the same corresponding row; vertical signal lines 1107 each of which is connected in common to circuits of cells 1101 provided in the same corresponding column; a vertical shift register 1002 which selects cells belonging to any row in the pixel array 1001 via a corresponding transfer gate wire 1104; a CDS circuit 1003 which removes noise from a signal transmitted through the vertical signal line 1107; selection transistors 1004 which transfer a signal from the CDS circuit 1003 to a horizontal signal line 1006; and a horizontal shift register 1005 which controls the selection transistors 1004. Specifically, the vertical signal line 1107 and the power supply line 1106 are provided in each column, extending vertically, while the transfer gate wire 1104 and the reset gate wire 1105 are provided in each row.

-Layout of Pixel Array of Solid-state Imaging Device-

Figure 16A:
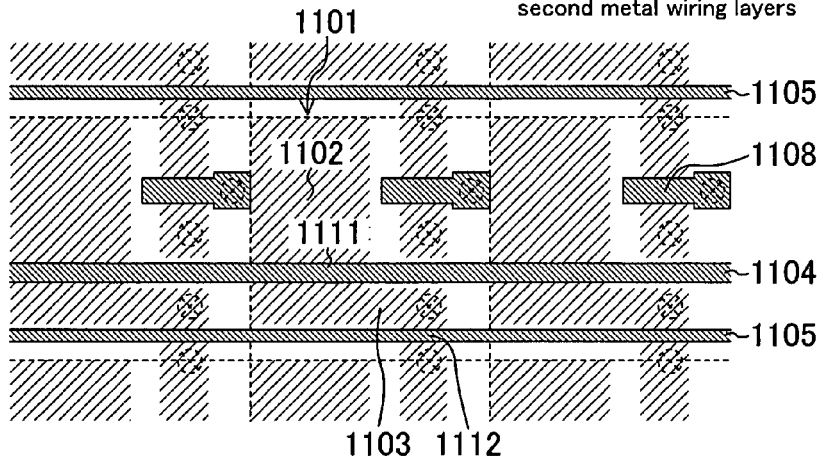
FIGS. 16A to 16C are plan views illustrating a layout of the pixel array of the solid-state imaging device of the fifth embodiment of the present invention.
Figure 16B:
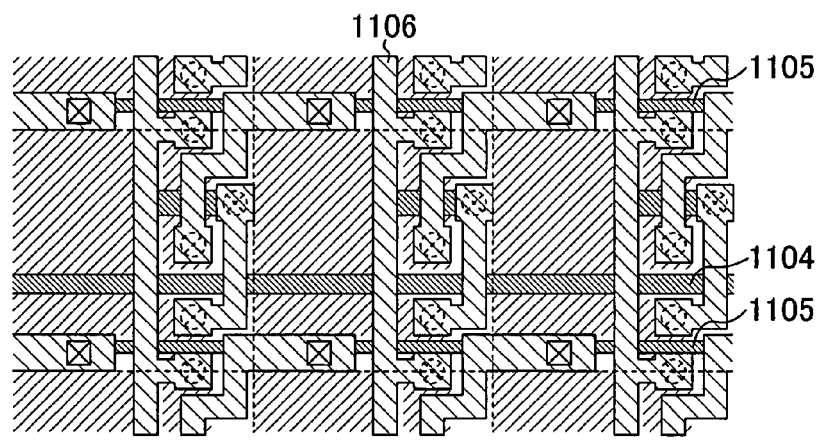
Figure 16C:
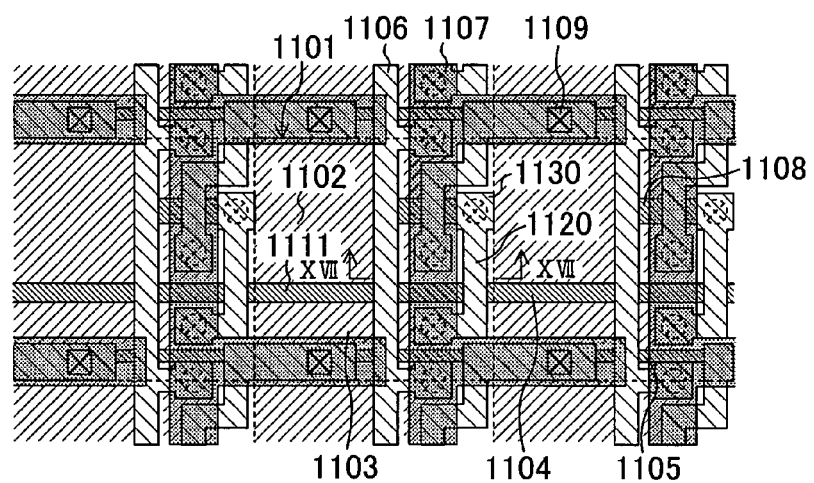

FIGS. 16A to 16C are plan views illustrating a layout of the pixel array of the solid-state imaging device of the fifth embodiment of the present invention. FIG. 16A illustrates a polysilicon wiring layer, and contacts connecting a diffusion layer or polysilicon wires formed on a semiconductor substrate and a first wiring layer, in the pixel array. FIG. 16B illustrates wires formed in the first wiring layer or below, contacts connecting the diffusion layer and the like and the first wiring layer, and contacts connecting the first wiring layer and a second wiring layer. FIG. 16C further illustrates wires formed in the second wiring layer. In FIGS. 16A to 16C, each portion surrounded by a dashed line is a cell 1101. FIG. 17 is a cross-sectional view of the solid-state imaging device of the fifth embodiment, taken along line XVII-XVII of FIG. 16C. As illustrated in FIG. 17, an STI (Shallow Trench Isolation) is formed in each isolation region on the semiconductor substrate 1010. A photodiode ("PD" in FIG. 17) is formed in each active region 1020 surrounded by the isolation regions. An interlayer insulating film is formed between the polysilicon wiring layer and the first wiring layer and between the first wiring layer and the second wiring layer. Color filters 1040 are formed over the second wiring layer via an interlayer insulating film. Microlenses 1050 for collecting incident light onto the photodiodes are formed on the color filters 1040. The color filters 1040 have, for example, three colors (blue, green and red). A color filter 1040 having any one of the colors is provided over each photodiode.

The solid-state imaging device of this embodiment is characterized in that the layout of the wires and the like is different from that of conventional solid-state imaging devices.

In the cell 1101 of the solid-state imaging device of this embodiment, as illustrated in FIGS. 16A to 16C, the photodiode 1102 is in the shape of a quadrangle. The photodiodes 1102 are arranged in a matrix in the pixel array.

A portion of the transfer gate wire 1104 which is interposed between impurity diffusion regions (the source and drain regions of the transfer transistor 1111) when viewed from the top, functions as the gate electrode of the transfer transistor 1111. A portion of the reset gate wire 1105 which is interposed between impurity diffusion regions (the source and drain regions of the reset transistor 1112), functions as the gate electrode of the reset transistor 1112. The gate electrodes of the transfer gate wire 1104, the reset gate wire 1105, and the amplifying transistor 1108 are formed of a polysilicon layer provided on the semiconductor substrate via a gate insulating film.

The FD 1103 which is formed in the semiconductor substrate and includes, for example, an n-type impurity, is connected to the gate electrode of the amplifying transistor 1108 via an FD wire 1120 including a contact region 1130. The FD wire 1120 connects the gate electrode of the amplifying transistor 1108 and the drain of the transfer transistor 1111.

In the solid-state imaging device of this embodiment, the FD wire 1120 and the power supply line 1106 are formed of metal wires provided in the first wiring layer over the pixel array. The vertical signal line 1107 is formed of a metal wire provided in the second wiring layer over the first wiring layer. Note that three or more wiring layers may be provided, and in this case, at least the vertical signal line 1107 is provided in an upper wiring layer than the FD wire 1120 (or the power supply line 1106).

The position in the cell 1101 of the vertical signal line 1107 is increasingly shifted toward a center line of the pixel array as the distance of the vertical signal line 1107 from the center of the pixel array increases, so as to improve the oblique incident light characteristics.

Also, in the solid-state imaging device of this embodiment, the contacts 1109 for connecting the first wiring layer and the second wiring layer to electrically connect the source of the amplifying transistor 1108 and the vertical signal line 1107 are provided at positions in the column direction (the vertical direction in FIG. 16) when viewed from the photodiode 1102.

-Operation and Action/Effect of Solid-state Imaging Device-

An operation of the thus-configured solid-state imaging device of this embodiment will be described.

Initially, when a reset pulse signal is output from the vertical shift register 1002, the reset transistor 1112 is turned ON, so that the potential of the FD 1103 is equal to the potential of the power supply line 1106, i.e., the FD 1103 is initialized. Next, when light impinges on the cell 1101, electric charges are accumulated in the photodiode 1102. Next, electric charges accumulated in the photodiode 1102 are transferred via the transfer transistor 1111 selected by the vertical shift register 1002 to the FD 1103. By the transferred electric charge, the potential of the FD 1103 is changed. Assuming that n electrons are accumulated in the photodiode 1102 by photoelectric conversion, an electric charge quantity Q of "elementary electric charge×n (n times elementary electric charge)" is transferred to the FD 1103. A variation V in potential of the FD 1103 is represented by:

$$\Delta V = Q/C = (\text{elementary electric charge} \times n)/C \quad (1)$$

where C represents the capacitance of the FD 1103.

When the potential of the FD 1103 is changed, the potential of the vertical signal line 1107 is changed via the amplifying transistor 1108. As can be seen from expression (1), the potential variation of the FD 1103 is inversely proportional to the capacitance of the FD 1103.

Here, the capacitance of the FD 1103 is formed of the parasitic capacitances between the FD 1103 and the surrounding wires, and the gate capacitances of the amplifying transistor 1108, the transfer transistor, and the reset transistor 1112, a diffusion capacitance, and the like. Therefore, when the vertical signal line 1107 is shifted due to shrink, in conventional wire layouts the parasitic capacitance is changed and the value of the potential variation of the FD 1103 is changed. In other words, even when the cells 1101 are positioned so that the same light is received, the potential variation of the FD 1103 varies, and the influence is transferred via the amplifying transistor 1108 to the vertical signal line 1107, resulting in the occurrence of irregularity in the brightness of an output image (hereinafter this state is referred to as shading). However, in the solid-state imaging device of this embodiment, as illustrated in FIG. 17, the vertical signal line 1107 is formed of a metal wire provided in the second wiring layer. During reading of a signal, the potential of the vertical signal line 1107 varies, following the potentials of the FD 1103 and the FD wire 1120. In contrast to this, since the potential of the power supply line 1106 is theoretically constant, the variation in capacitance of the FD 1103 can be reduced according to the wire layout of this embodiment, as compared to when the power supply line 1106 is provided in the second wiring layer and is shifted.

Specifically, a potential variation ΔV' during reading of a signal of the vertical signal line 1107 is represented by:

$$\Delta V' = A\Delta V \quad (2)$$

where A represents the gain of the amplifying transistor 1108.

Therefore, a parasitic capacitance C' between the vertical signal line 1107 and the FD 1103 is represented by:

$$C' = \Delta Q/\Delta V = C''(\Delta V - \Delta V')/\Delta V = C''(1-A) \quad (3)$$

where C" representes a parasitic capacitance when the power supply line is provided in the second wiring layer.

Thus, C' is reduced by a factor of (1−A). Therefore, if the vertical signal line 1107 is provided in the second wiring layer and is shifted due to shrink, a variation in capacitance between wires of the FD 1103 in each cell 1101 can be reduced by a factor of (1−A) while improving oblique incident light characteristics. As a result, the occurrence of shading can be suppressed.

Also, in the solid-state imaging device of this embodiment, the vertical signal line 1107 is formed of a wire having a minimum width in the second wiring layer, so that a parasitic capacitance generated in the FD 1103 is reduced.

Also, in the solid-state imaging device of this embodiment, the contacts 1109 for connecting the source of the amplifying transistor 1108 and the vertical signal line 1107 provided in the second wiring layer are provided at positions in the vertical direction (in the column direction) when viewed from the photodiode 1102. With this configuration, the incident characteristics of light obliquely entering in the horizontal direction (in the row direction) of the photodiode 1102 can be improved. When the shape of the photodiode 1102 is elongated in the vertical direction, the photodiode 1102 receives a smaller amount of light entering from the horizontal direction than that of light entering from the vertical direction. This configuration is effective for obtaining of satisfactory video. Note that the "vertical direction" as used herein refers to a direction in which the vertical signal line 1107 is extended, and the "horizontal direction" as used herein refers to a direction which is parallel to a substrate surface and is perpendicular to the vertical direction.

Although, in this embodiment, an example has been described in which two wiring layers are provided in addition to the polysilicon wiring layer, three or more wiring layers may be provided as described above. In this case, if the vertical signal line 1107 is provided in the uppermost wiring layer, the parasitic capacitance between the FD 1103 and the FD wire 1120 can be preferably reduced. On the other hand, particularly, when the interlayer insulating film formed between the wiring layers is thin, the power supply line 1106 (or the FD wire 1120) can be provided in a lower layer (e.g., lower than the vertical signal line 1107) in the effective pixel region. This is because, if the power supply line 1106 is provided in an upper layer, it is difficult for oblique incident light to enter the photodiode 1102, resulting in a reduction in performance.

Although FIGS. 16A to 16C illustrate an example in which the photodiode 1102 is in the shape of a quadrangle elongated in the horizontal direction, the shape of the photodiode 1102 is not limited to this. Alternatively, the photodiode 1102 may be in any shape, such as elongated in the horizontal direction, having the shape of an ellipse, or the like. Also, even when the present invention is applied to a so-called multiple-pixels-per-cell configuration in which a plurality of sets of a photodiode 1102 and a transfer transistor 1111 are provided in each cell 1101, or a configuration of the cell 1101 in which a selection transistor is provided between the output portion (source) of the amplifying transistor 1108 and a vertical signal line, an effect similar to that of the solid-state imaging device of this embodiment can be expected. Note that, although will be described in an embodiment below, in the case of the multiple-pixels-per-cell configuration, at least a plurality of photodiodes 1102 and a plurality of transfer transistors 1111 may be provided in each cell 1101. Also, although the cells 1101 may not be necessarily arranged in a matrix, the photodiodes 1102 are preferably arranged in a matrix.

Sixth Embodiment

Figure 18:
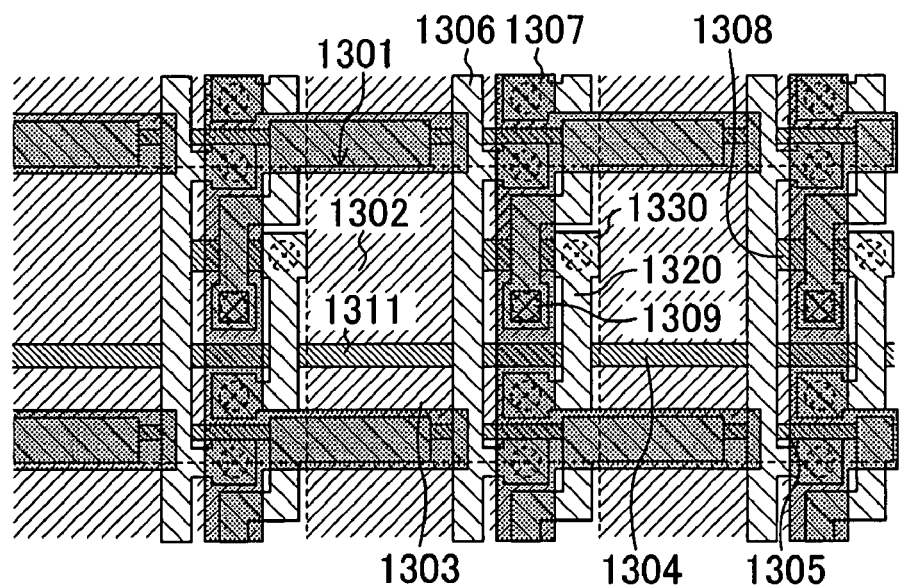
FIG. 18 is a plan view illustrating a layout of a pixel array of a solid-state imaging device according to a sixth embodiment of the present invention.

FIG. 18 is a plan view illustrating a layout of a pixel array of a solid-state imaging device according to a sixth embodiment of the present invention. Each portion surrounded by a dashed line is a cell 1301.

The cell 1301 of this embodiment comprises: a photodiode 1302; an FD 1303; a transfer transistor 1311; a reset transistor 1312; an amplifying transistor 1308 having a gate electrode connected to the FD 1303, a drain connected to the power supply line 1306, and a source connected to the vertical signal line 1307 to form a source follower; a transfer gate wire 1304 a portion of which functions as the gate electrode of the transfer transistor 1311; and a reset gate wire 1305 a portion of which functions as the gate electrode of the reset transistor 1312. Also, on the cell 1301, an FD wire 1320 including a contact region 1330 for connecting the FD 1303 and the gate electrode of the amplifying transistor 1308 is provided.

The configuration of the cell 1301 of this embodiment is basically the same as the cell 1101 of FIGS. 16A to 16C, but is different in that contacts 1309 for connecting the first wiring layer and the second wiring layer to electrically connect the vertical signal line 1307 formed in the second wiring layer and the FD 1303 are positioned in the horizontal direction (in the row direction) of the photodiode 1302.

By providing the contacts 1309 for electrically connecting the vertical signal line 1307 and the FD 1303 in this manner, the incident characteristics of light entering from the vertical direction (vertical direction in FIG. 18) can be improved. Particularly when the photodiode 1302 has a shape elongated in the horizontal direction, it is difficult for light to enter from the vertical direction, and therefore, this configuration is preferable. Therefore, the solid-state imaging device of this embodiment can suppress a variation in parasitic capacitance occurring in the FD 1303, and improve the optical characteristics.

Seventh Embodiment

Figure 19:
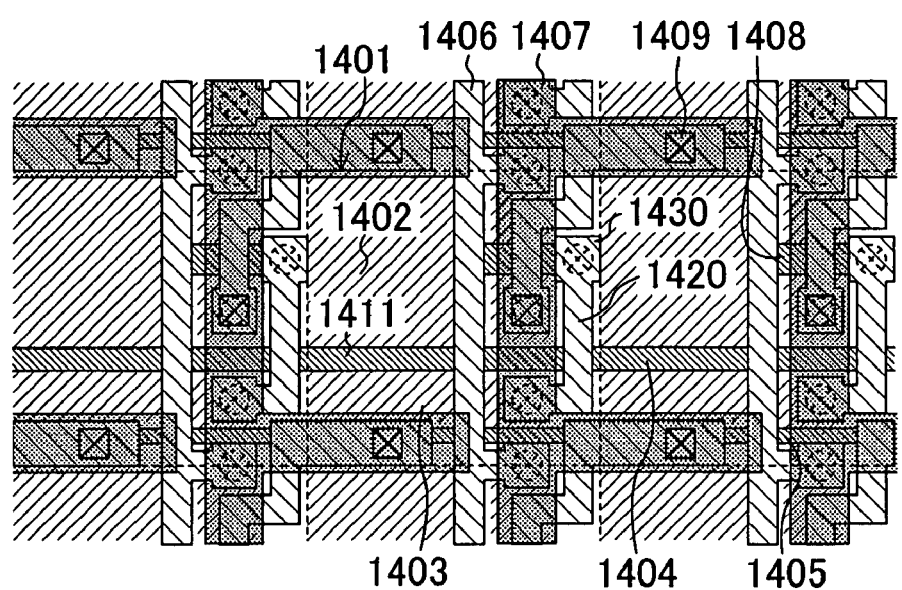
FIG. 19 is a plan view illustrating a layout of a pixel array of a solid-state imaging device according to a seventh embodiment of the present invention.

FIG. 19 is a plan view illustrating a layout of a pixel array of a solid-state imaging device according to a seventh embodiment of the present invention.

A cell 1401 of this embodiment comprises: a photodiode 1402; an FD 1403; a transfer transistor 1411; a reset transistor 1412; an amplifying transistor 1408 which has a gate electrode connected to the FD 1403, a drain connected to a power supply line 1406, and a source connected to a vertical signal line 1407 to form a source follower; a transfer gate wire 1404 a portion of which functions as the gate electrode of the transfer transistor 1411; and a reset gate wire 1405 a portion of which functions as the gate electrode of the reset transistor 1412. Also, on the cell 1401, an FD wire 1420 including a contact region 1430 for connecting the FD 1403 and the gate electrode of the amplifying transistor 1408 is provided.

The configuration of the cell 1401 of this embodiment is basically the same as that of the cell 1101 of FIG. 16, but is different in that contacts 1409 and 1410 for electrically connecting the first wiring layer and the second wiring layer to electrically connecting the vertical signal line 1407 formed in the second wiring layer and the FD 1403 are positioned in the horizontal direction and in the vertical direction, respectively, of the photodiode 1402.

With this configuration, when viewed from the photodiode 1402, the amount of light entering from the vertical direction and the amount of light entering from the horizontal direction can be caused to be equal to each other. Particularly, when the photodiode 1402 is in the shape of a square, this configuration is preferable.

According to the solid-state imaging device of this embodiment, by providing the contacts 1409 and 1410 for connecting the vertical signal line 1407 and the FD 1403 at positions in the horizontal direction and in the vertical direction of the photodiode 1402, a variation in incident characteristics of light entering from the vertical direction and the horizontal direction can be suppressed. Also, since two contacts (two positions) connected to the vertical signal line in the second wiring layer are provided in each cell 1401, a connection defect is less likely to occur as compared to when only one contact is provided.

Eighth Embodiment

Figure 20:
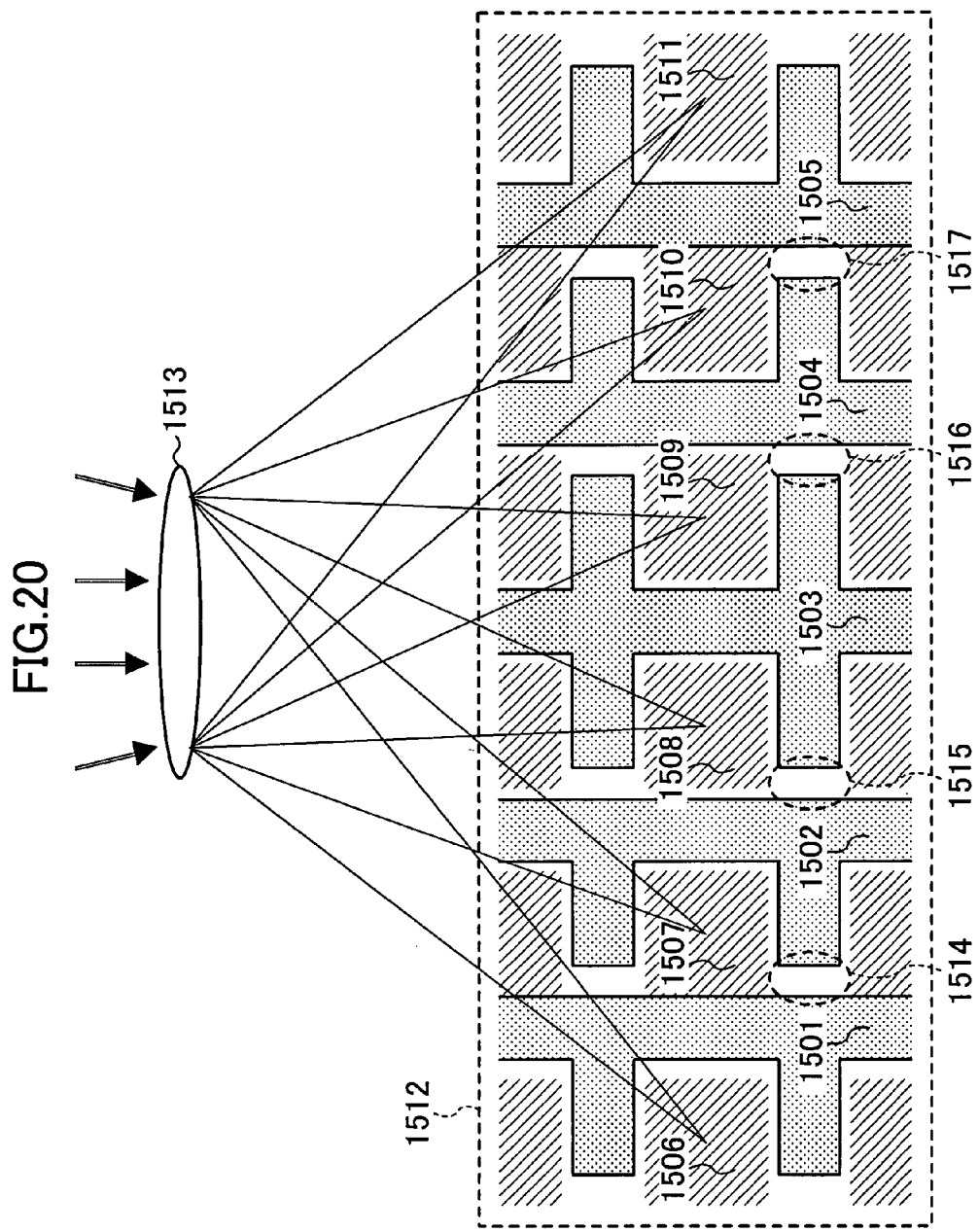
FIG. 20 is a plan view schematically illustrating a layout of a pixel array of a solid-state imaging device according to an eighth embodiment of the present invention.

FIG. 20 is a plan view schematically illustrating a layout of a pixel array of a solid-state imaging device according to an eighth embodiment of the present invention.

In the solid-state imaging device of this embodiment, a pixel array 1512 is formed which has a configuration basically similar to those of the first and seventh embodiments. Also, an imaging apparatus having the solid-state imaging device comprises a lens 1513 for collecting external light onto photodiodes 1506, 1507, 1508, 1509, 1510, and 1511 in the pixel array 1512, over the pixel array 1512.

As illustrated in FIG. 20, in the pixel array 1512 of the solid-state imaging device of this embodiment, vertical signal lines 1501, 1502, 1503, 1504 and 1505 which are formed in a second wiring layer and are shrunk are arranged as if they partitioned a region over photodiodes 1506, 1507, 1508, 1509, 1510 and 1511. Thereby, it is possible to suppress light from leaking into the photodiodes 1506, 1507, 1508, 1509, 1510 and 1511 from adjacent cells, thereby making it possible to suppress the occurrence of a mixed color.

Also, the vertical signal lines 1501, 1502, 1503, 1504 and 1505 are electrically separated. Spaces 1514, 1515, 1516 and 1517 are provided in portions where an interval between adjacent vertical signal lines is minimum. The spaces 1514, 1515, 1516 and 1517 of the vertical signal lines 1501, 1502, 1503, 1504 and 1505 are arranged so that the interval is minimum in the same layer of the pixel array 1512. Thereby, it is possible to suppress the occurrence of a mixed color.

Also, the spaces 1514, 1515, 1516 and 1517 are positioned at corners in the plan view when viewed from the photodiodes 1506, 1507, 1508, 1509, 1510 and 1511. When the spaces 1514, 1515, 1516 and 1517 are provided in the vertical direction when viewed from the photodiodes 1506, 1507, 1508, 1509, 1510 and 1511, a mixed color is likely to occur when light passes through the spaces 1514, 1515, 1516 and 1517. Particularly at a center of the photodiode, photoelectric conversion is most effectively performed, so that a mixed color has a large influence. Therefore, by providing the spaces 1514, 1515, 1516 and 1517 at corner positions when viewed from the closest photodiodes 1506, 1507, 1508, 1509, 1510 and 1511, it can be made difficult for light to leaking into the photodiodes 1506, 1507, 1508, 1509, 1510 and 1511 from cells adjacent in the vertical direction thereto.

Also, light passing through the lens 1513 radially enters each cell from above the center of the pixel array 1512, and therefore, the spaces 1514, 1515, 1516 and 1517 are provided adjacent to respective portions of the vertical signal lines 1501, 1502, 1503, 1504 and 1505 which have maximum distances in the row direction from a center line extending in the column direction (vertical direction) of the pixel array 1512.

As described above, in the solid-state imaging device of this embodiment, it is possible to reduce a variation in capacitance occurring in the FD due to shrink, without a deterioration in the oblique incident light characteristics.

Ninth Embodiment

-Outline of Configuration of Pixel Array-

Figure 21:
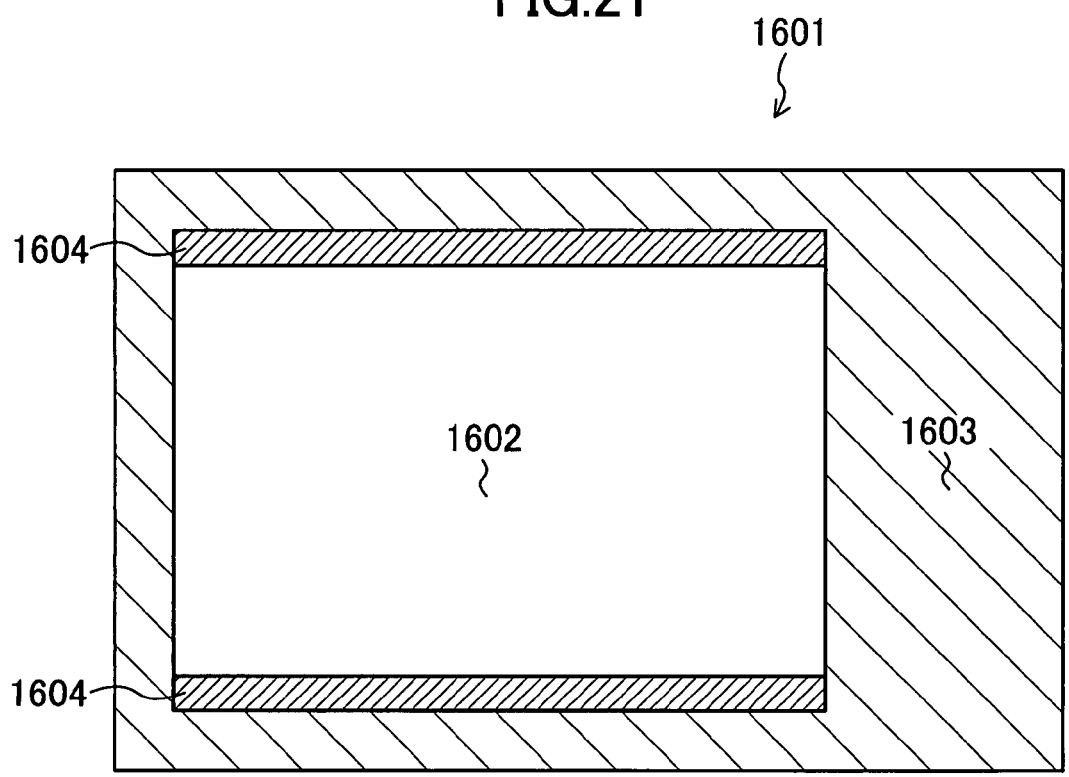
FIG. 21 is a plan view schematically illustrating a pixel array of a solid-state imaging device according to a ninth embodiment of the present invention.

FIG. 21 is a plan view schematically illustrating a pixel array of a solid-state imaging device according to a ninth embodiment of the present invention.

As illustrated in FIG. 21, in the solid-state imaging device of this embodiment, a pixel array 1601 comprises: an effective pixel region 1602 in which a plurality of effective pixels are arranged in a matrix; a light-shielded pixel region 1603 in which a plurality of light-shielding pixels are arranged in a matrix, and which surrounds the effective pixel region 1602; and wiring layer changing regions 1604 which are provided between the effective pixel region 1602 and the light-shielded pixel region 1603 and are adjacent in the vertical direction to the effective pixel region 1602, and in which cells are arranged in a column or row.

In the effective pixel region 1602, for example, any of the cells described in the first to eighth embodiments is provided.

In the light-shielded pixel region 1603 and the wiring layer changing region 1604, cells in each of which a photodiode and the like are formed are arranged in a matrix as in the effective pixel region 1602, but light received by these photodiodes is not converted into a video signal (or imaging). Note that signals from cells formed in the light-shielded pixel region 1603 are used so as to set a black color as a reference.

The layout of the cells provided in the light-shielded pixel region 1603 is partly different from the layout of the cells provided in the effective pixel region 1602 as described above.

-Layout of Cells in Light-shielded Pixel Region-

Figure 22A:
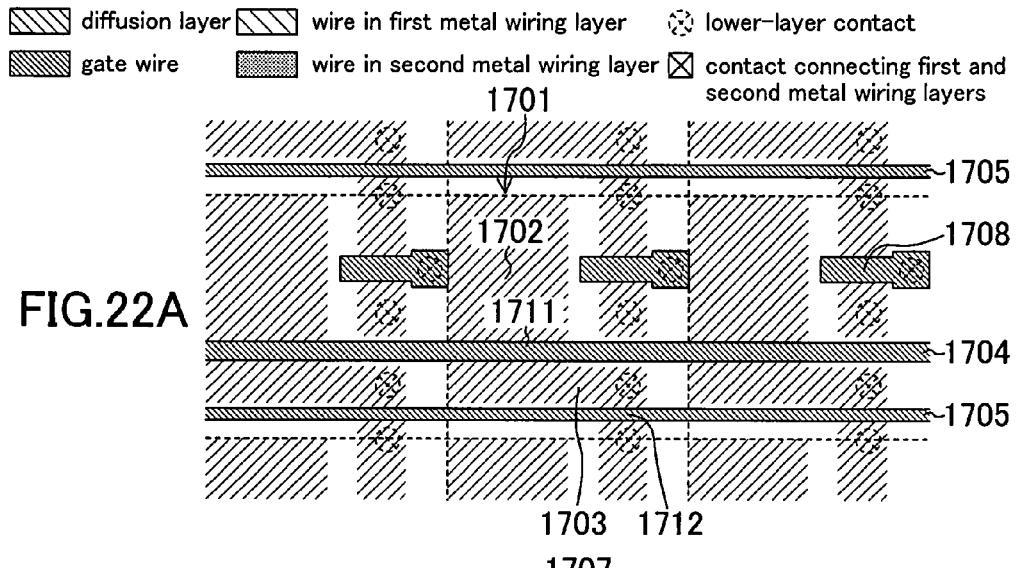
FIGS. 22A to 22C are plan views illustrating a layout of a light-shielded pixel region of the solid-state imaging device of the ninth embodiment.
Figure 22B:
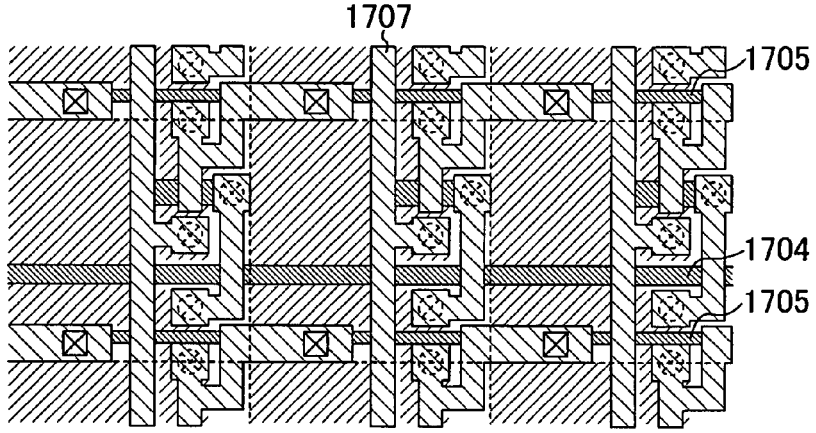
Figure 22C:
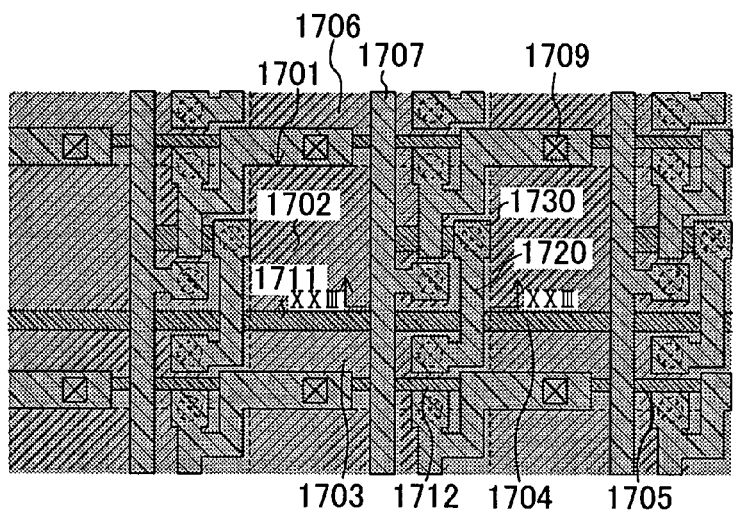

FIGS. 22A to 22C are plan views illustrating a layout of a light-shielded pixel region of the solid-state imaging device of the ninth embodiment. FIG. 22A illustrates a polysilicon wiring layer, and contacts connecting a diffusion layer or polysilicon wires formed on a semiconductor substrate and a first wiring layer in the light-shielded pixel region. FIG. 22B illustrates wires formed in the first wiring layer or below, contacts connecting the diffusion layer and the like and the first wiring layer, and contacts connecting the first wiring layer and a second wiring layer. FIG. 22C further illustrates wires formed in the second wiring layer. In FIGS. 22A to 22C, each portion surrounded by a dashed line is a cell 1701. FIG. 23 is a cross-sectional view of the solid-state imaging device of the ninth embodiment, taken along line XXIII-XXIII of FIG. 22C.

A cell 1701 of this embodiment comprises: a photodiode 1702 which accumulates an amount of electric charges corresponding to the intensity of received light; an FD 1703 to which electric charges accumulated by the photodiode 1702 are transferred; a transfer transistor 1711 which is controlled by a transfer gate wire 1704 to control transfer of electric charges from the photodiode 1702 to the FD 1703; a capacitance including a wire capacitance and the like connected to the FD 1703; a reset transistor 1712 which is controlled by a reset gate wire 1705 to initialize the potential of the FD 1703; and an amplifying transistor 1708 which has a gate electrode connected to the FD 1703, a drain connected to a power supply line 1706, and a source connected to a vertical signal line 1707 to form a source follower. The photodiode 1702 and the FD 1703 are formed on the semiconductor substrate 1010 and in active regions 1020 surrounded by isolation regions.

Note that, as illustrated in FIGS. 22B and 23, FD wires 1720 are formed in the first wiring layer, and have the same shape as that of the cells in the effective pixel region 1602 when viewed from the top. In other words, the shape of the FD wires 1720 is the same in the effective pixel region 1602 and the light-shielded pixel region.

The cell 1701 in the light-shielded pixel region 1603 is different from the cell in the effective pixel region 1602 in that, as illustrated in FIGS. 22B and 22C, the vertical signal line 1707 is provided in the first wiring layer and the power supply line 1706 is provided in the second wiring layer over the first wiring layer, and the power supply line 1706 is formed to cover the whole cell so that light does not enter the photodiode 1702.

Since the power supply line 1706 covers over the whole cell 1701, light is prevented from entering the photodiode 1702, thereby making it possible to more accurately set a black color as a reference. Also, the reason why the power supply line 1706 is formed as a metal wire in the second wiring layer rather than in the effective pixel region 1602 is that, if the power supply line 1706 is formed in the first wiring layer, contacts connected to the vertical signal line 1707 and the like cannot be formed.

Further, over the cell 1701 of this embodiment, the vertical signal line 1707 has substantially the same shape as that of a power supply line (e.g., the power supply line 1106 of FIG. 16C) over the cell in the effective pixel region 1602. Thereby, the shape of the surrounding wire when viewed from the FD 1703 can be caused to be substantially the same as that of the FD 1103 of the cell 1101 (see FIG. 16). Thereby, a variation in capacitance occurring in the FD 1703 can be suppressed in the cell in the effective pixel region 1602 and in the cell in the light-shielded pixel region 1603, thereby making it possible to suppress the occurrence of shading and the like.

-Layout of Cells in Wiring Layer Changing Region-

FIGS. 24A to 24C are plan views illustrating a layout of cells provided in the wiring layer changing region of the solid-state imaging device of the ninth embodiment of the present invention. FIG. 24A illustrates a polysilicon wiring layer, and contacts connecting a diffusion layer or polysilicon wires formed on a semiconductor substrate and the first wiring layer, in the wiring layer changing region. FIG. 24B illustrates wires in the first wiring layer or below, and contacts connecting the diffusion layer and the like and the first wiring layer, and contacts connecting the first wiring layer and a second wiring layer. FIG. 24C furthers illustrates wires formed in the second wiring layer. In FIGS. 24A to 24C, each region surrounded by a dashed line in the middle stage is a cell 1801 in the wiring layer changing region 1604 (see FIG. 21), each region in the upper stage is the light-shielded pixel region 1603, and each region in the lower stage is the effective pixel region 1602.

When the wiring layers in which the power supply line 1806 and the vertical signal line 1807 are provided are different between in the effective pixel region 1602 and in the light-shielded pixel region 1603 as in the solid-state imaging device of this embodiment, the wiring layer changing region 1604 for changing the wiring layers in which the wires are provided needs to be provided between the effective pixel region 1602 and the light-shielded pixel region 1603 using contacts. Note that, since both the vertical signal line 1807 and the power supply line 1806 are provided in the vertical direction, the wiring layer changing region 1604 is not provided in the lateral direction (horizontal direction) of the effective pixel region 1602.

As illustrated in FIGS. 24A to 24C, the cell 1801 in the wiring layer changing region 1604 comprises: a photodiode 1802; an FD 1803; a transfer transistor 1811 which is controlled by a transfer gate wire 1804; a capacitance including a wire capacitance and the like connected to the FD 1803; a reset transistor 1812 which is controlled by a reset gate wire 1805; an amplifying transistor 1808 which has a gate electrode connected to the FD 1803, a drain connected to the power supply line 1806 (the same as the power supply line 1706 of FIG. 22C), and a source connected to the vertical signal line 1807 to form a source follower; and an FD wire 1820.

In the wiring layer changing region 1604 of this embodiment, as illustrated in FIG. 24C, a plurality of contacts for changing wiring layers in which the power supply line 1806 is provided, from the second wiring layer to the first wiring layer, are provided. Thereby, as compared to when only one contact is formed, the electrical resistance can be reduced, and electrical connection can be secured even when a connection defect occurs in a portion of the contacts.

Also, in the wiring layer changing region 1604, a plurality of contacts for changing wiring layers in which the vertical signal line 1807 is provided, from the first wiring layer to the second wiring layer, are formed. Thereby, electrical resistance can be reduced in the vertical signal line 1807. Note that electrical resistance can also be reduced by causing the planar area of the contact in the vertical signal line 1807 and the power supply line 1806 to be larger than that of the other contacts. Note that, if these contacts have the same size as that of the other contacts, it is easy to manufacture them. Therefore, it is more preferable to produce a plurality of contacts having the same size as that of the other contacts.

Although FIGS. 24A to 24C indicate that the wiring layers are changed via one row of cells, the changing of the wiring layers can be achieved using two or more rows of cells. For example, the changing of the wiring layers may be performed for the power supply line 1806 using the first row of cells in the wiring layer changing region 1604, and the changing of the wiring layers may be performed for the vertical signal line 1807 using the second row of cells. Note that it is more preferable that the changing of the wiring layers be performed for both the power supply line 1806 and the vertical signal line 1807 using one cell as in this embodiment, since the area of the wiring layer changing region 1604 can be reduced.

Tenth Embodiment

A signal processing method according to a tenth embodiment of the present invention for a solid-state imaging device comprising a pixel array in which a wiring layer changing region 1604 as illustrated in FIG. 21 will be described.

The cell in the wiring layer changing region 1604 performs changing of wiring layers in which the vertical signal line and the power supply line are provided, and therefore, is different from the cell in the effective pixel region 1602 in the wire layout. Therefore, the efficiency of conversion from incident light into an electrical signal in the photodiode is different between the cell in the effective pixel region and the cell in the wiring layer changing region 1604. Also, in the wiring layer changing region 1604, the photodiode cannot be completely shielded from incident light, and therefore, the cell in the light-shielded pixel region 1603 is different from the cell in the wiring layer changing region 1604 in the behavior of the photodiode. Therefore, if signal processing is performed using data from the entire pixel array including the wiring layer changing region 1604, high-quality video cannot be obtained. Therefore, in the signal processing method of this embodiment, data processing is performed, assuming that data from the cell provided in the wiring layer changing region 1604 is invalid.

Figure 25A:
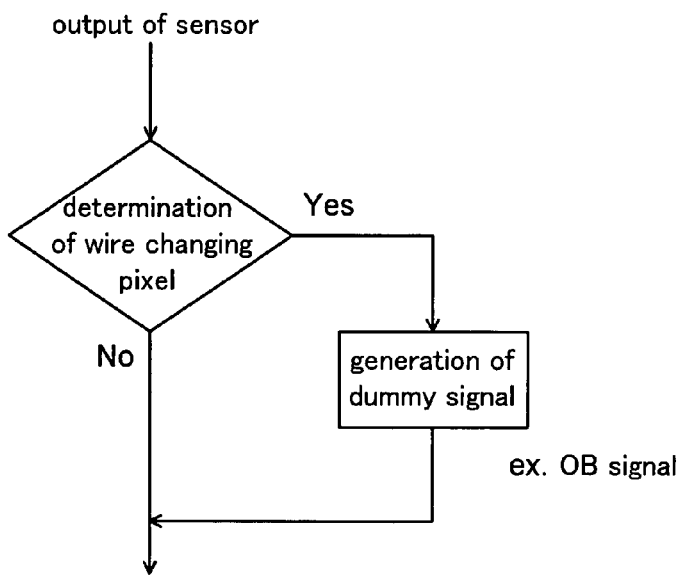
FIG. 25A is a flowchart illustrating an example of the signal processing method of this embodiment.

FIG. 25A is a flowchart illustrating an example of the signal processing method of this embodiment.

Initially, a signal generated in the pixel array is output through a horizontal signal line (reference numeral 1006 in FIG. 15). Next, it is determined whether or not the signal output from the horizontal signal line is a signal output from the wiring layer changing region 1604. As a result, if it is determined that the signal is not a signal output from the wiring layer changing region 1604, the signal is directly transferred to the signal processing circuit or the like. If it is determined that the signal is a signal output from the wiring layer changing region 1604, instead of the signal an invalid signal is transferred to the video signal processing section or the like. According to this method, the signal output from the cell in the wiring layer changing region 1604, which has characteristics different from those of the cell in the effective pixel region 1602, is not processed as a video signal, so that high-quality video in which shading is suppressed can be achieved.

Figure 25B:
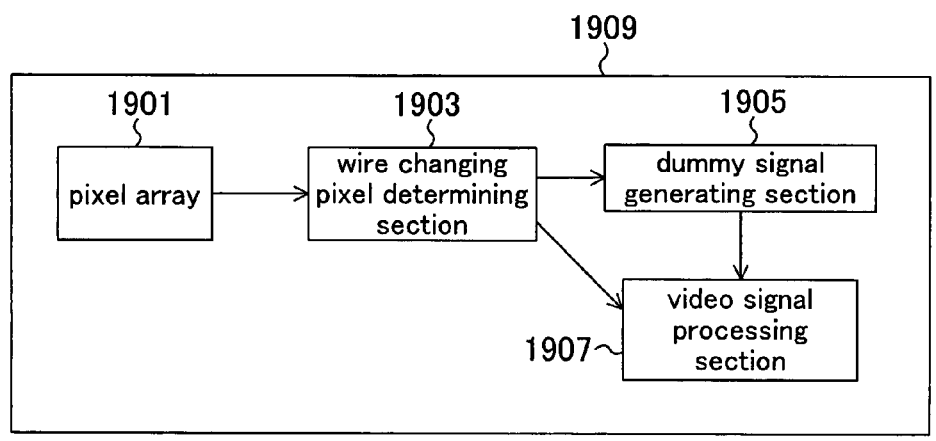
FIG. 25B is a block diagram illustrating an exemplary configuration of a solid-state imaging device in which the signal processing method of the tenth embodiment is implemented.

FIG. 25B is a block diagram illustrating an exemplary configuration of a solid-state imaging device in which the signal processing method of this embodiment is implemented. As illustrated in FIG. 25B, the solid-state imaging device 1909 comprises: a pixel array 1901 in which an effective pixel region, a wiring layer changing region, and a light-shielded pixel region are formed; a wire changing pixel determining section 1903 which receives a signal output from the pixel array 1901, and determines whether or not the signal is a signal output from a cell in the wiring layer changing region; a dummy signal generating section 1905 which outputs a dummy signal when the signal is a signal output from a cell in the wiring layer changing region; and a video signal processing section 1907 which receives and processes the signal when the signal is not a signal output from a cell in the wiring layer changing region (the signal is a signal output from a cell in the effective pixel region or the light-shielded pixel region). For example, the pixel array 1901, the wire changing pixel determining section 1903, the dummy signal generating section 1905, and the video signal processing section 1907 are formed on the same chip.

Thus, when a circuit for performing signal processing is formed on the same chip on which a light sensing pixel array and the like are formed, the whole size of an imaging apparatus (a digital camera or the like) comprising a solid-state imaging device can be reduced.

In contrast to this, the signal processing method of this embodiment can be implemented even when a signal output from the pixel array is processed by an external signal processing circuit (Digital Signal Processor; DSP). In this case, the imaging apparatus comprises a chip on which a DSP for processing a signal output from the pixel array to generate video, in addition to a chip on which the pixel array 1001 and its surrounding circuits (the vertical shift register 1002, the horizontal shift register 1005, the CDS 1107, and the like) as illustrated in FIG. 15 are formed. The DSP has a circuit for determining whether or not a signal output from the pixel array is a signal output from a cell in the wiring layer changing region of FIG. 25A, a circuit for generating a dummy generation signal, and a circuit for processing a signal.

With such a configuration, for example, it is possible to optimize the configuration of each of the chip on which the pixel array is formed and the chip on which the DSP is formed, so that signal processing speed can be improved as compared to when the circuit for processing a signal and the pixel array are formed on the same chip.

Eleventh Embodiment

Figure 26:
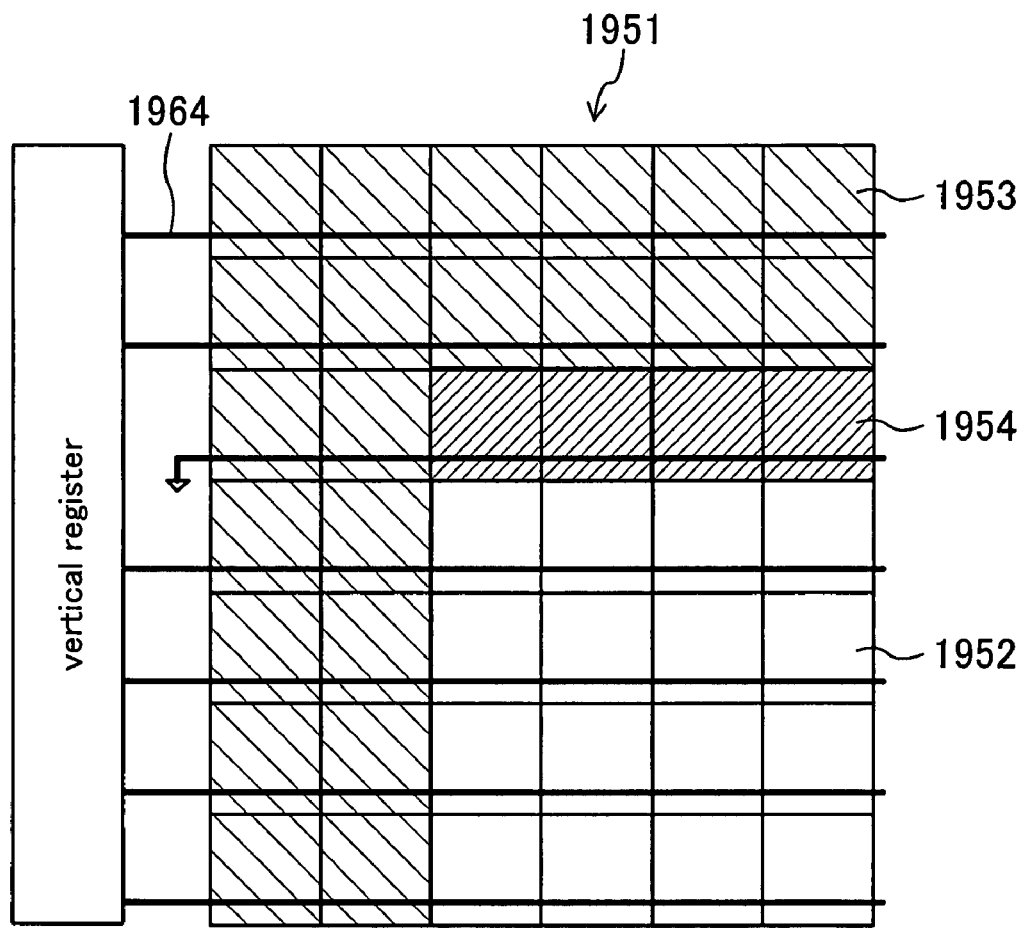
FIG. 26 is a diagram illustrating an outline of a pixel array of a solid-state imaging device according to an eleventh embodiment of the present invention.
Figure 27A:
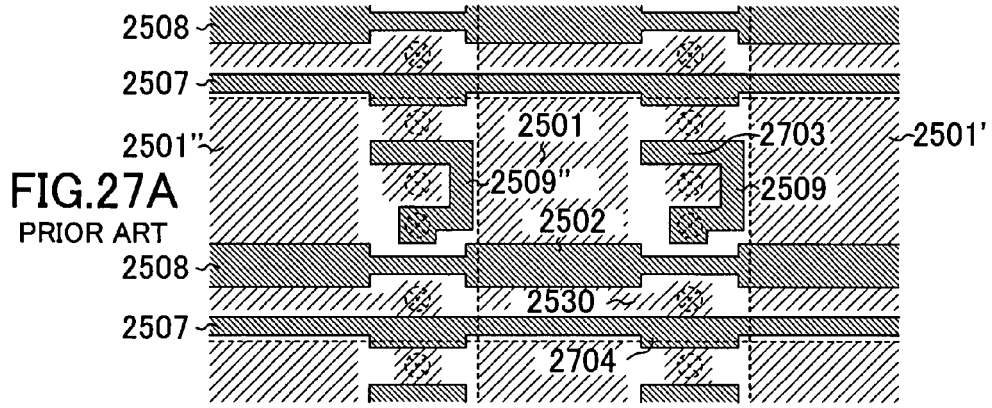
FIGS. 27A to 27C are plan views illustrating cells in a MOS solid-state imaging device according to a first conventional example.
Figure 27B:
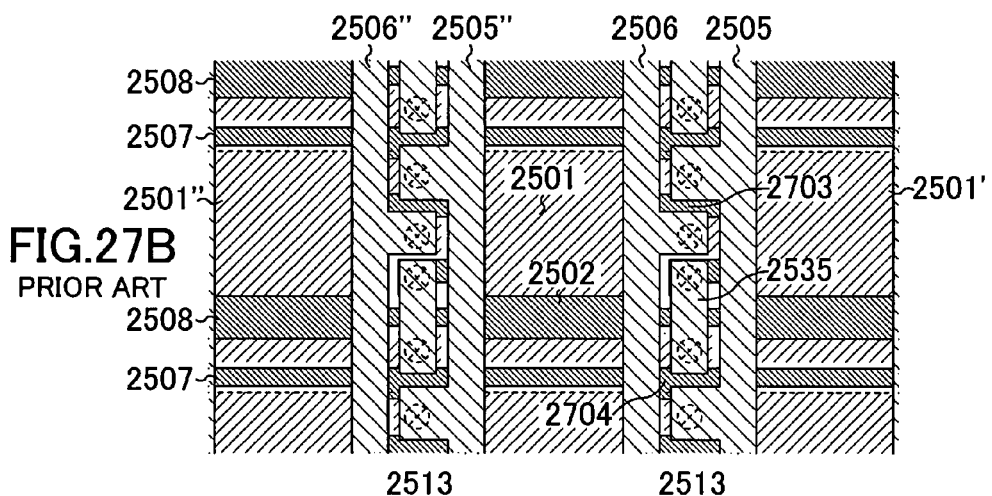
Figure 27C:
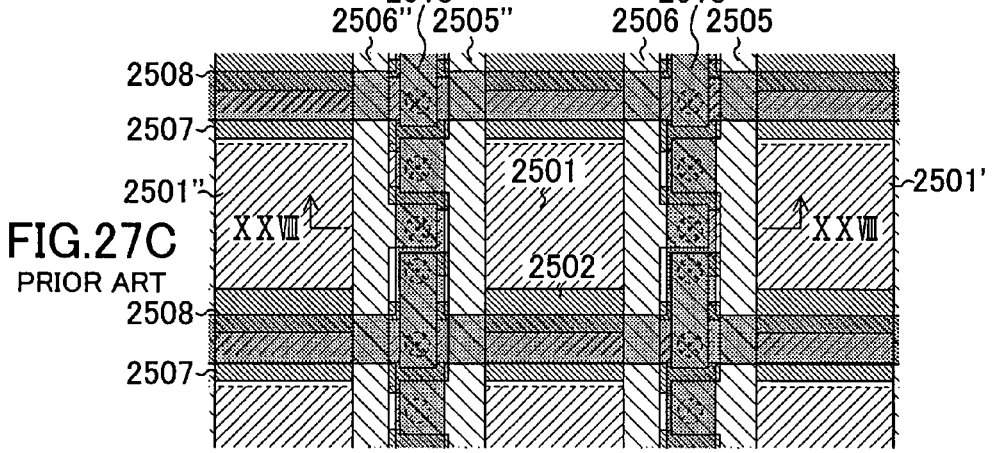
Figure 28:
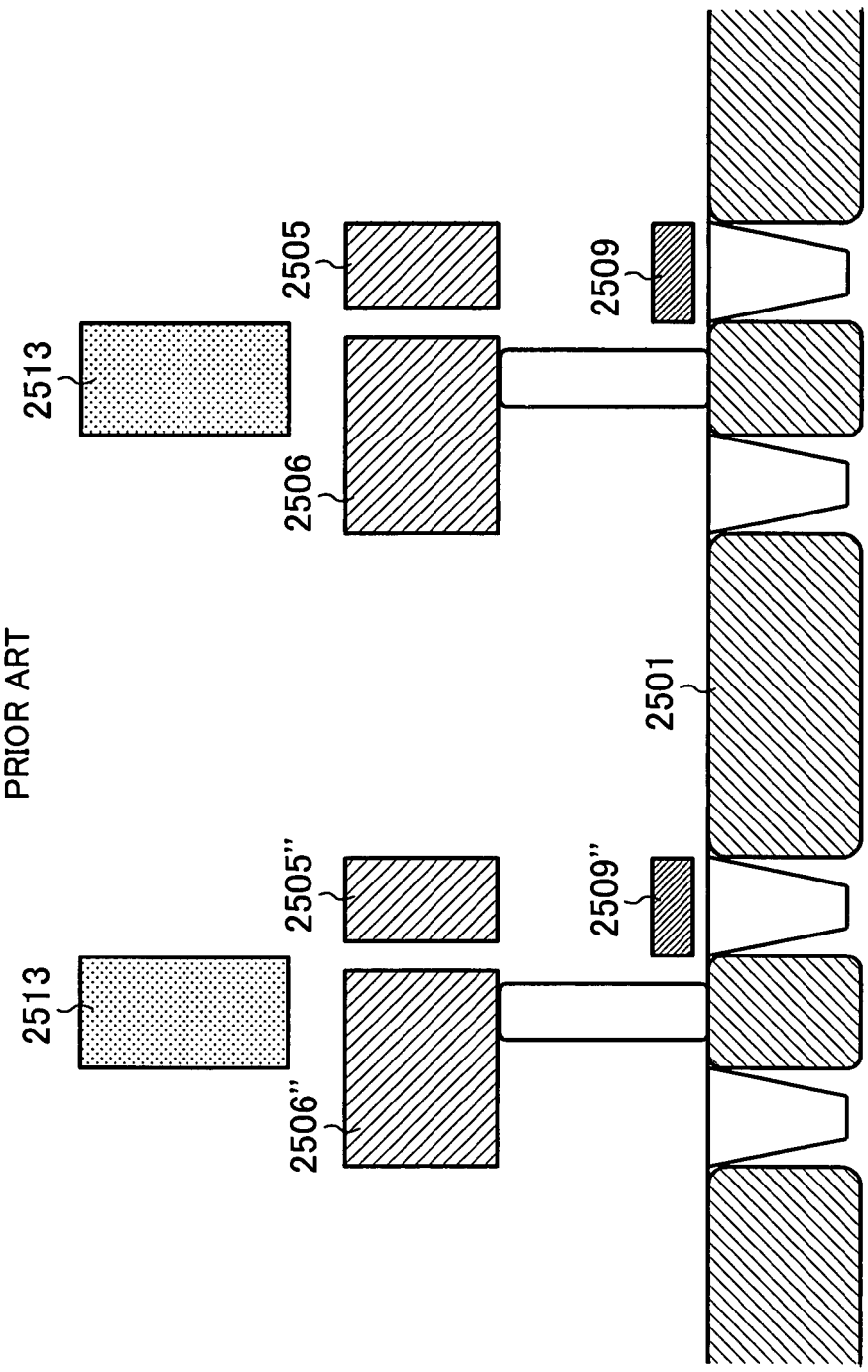
FIG. 28 is a diagram illustrating a cross-section of the solid-state imaging device of the first conventional example, taken along line XXVIII-XXVIII of FIG. 27C.

FIG. 26 is a diagram illustrating an outline of a pixel array of a solid-state imaging device according to an eleventh embodiment of the present invention.

As illustrated in FIG. 26, as is similar to the solid-state imaging device of the ninth embodiment of FIG. 21, the solid-state imaging device of this embodiment comprises: a pixel array 1951 in which an effective pixel region 1952, a light-shielded pixel region 1953, and a wiring layer changing region 1954 are formed, in each of which cells are provided; a plurality of transfer gate wires 1964 which are connected to the gate electrodes of transfer transistors provided in the cells, extending in the horizontal direction; and a vertical shift register which drives the transfer gate wires 1964.

The solid-state imaging device of this embodiment is different from that of the ninth embodiment in that, of the transfer gate wires 1964, transfer gate wires which are connected to the gate electrodes of transfer transistors provided in the wiring layer changing region 1954 are grounded without being connected to the vertical shift register.

Therefore, the transfer transistors provided in the wiring layer changing region 1954 are invariably in the OFF state (inactive state), so that a signal is not read from the cells provided in the wiring layer changing region 1954. As a result, in the solid-state imaging device of this embodiment, a process of invalidating a signal output from the cells provided in the wiring layer changing region 1954 is not required. Therefore, the occurrence of shading can be suppressed without reducing signal processing speed as compared to conventional solid-state imaging devices.

Particularly, in an imaging apparatus comprising a solid-state imaging device, when the pixel array 1951 and the DSP are provided on separate chips, a chip on which a conventional DSP is formed can be used, resulting in high general versatility.

Note that the number of transfer gate wires which are not connected to the vertical shift register is the same as the number of columns of cells provided in the wiring layer changing region 1954, and is one in the example of FIG. 26.

Also, the present invention is not limited to the circuit configuration of FIG. 26. The pixel array may have any circuit configuration in which the transfer transistors are invariably in the OFF state.

The above-described solid-state imaging device of the present invention is applicable to various imaging apparatuses, such as an imaging apparatus having a large number of pixels (e.g., a single-lens reflex digital camera, an HD camcorder, etc.), an imaging apparatus for a mobile telephone, and the like.

What is claimed is:

1. A solid-state imaging device comprising:
    a pixel array including photodiodes for accumulating an amount of electric charges corresponding to the intensity of received light, floating diffusions to which electric charges accumulated by the photodiodes are transferred, transfer transistors for controlling transfer of electric charges from the photodiodes to the floating diffusions, and amplifying transistors having a source from which a signal corresponding to electric charges transferred to the floating diffusion is output, wherein a plurality of cells are provided in the pixel array;
    a plurality of power supply lines provided over the pixel array and connected to drains of the amplifying transistors;
    a plurality of vertical signal lines provided over the pixel array and connected to sources of the amplifying transistors; and
    a plurality of floating diffusion wires provided over the pixel array, connecting gate electrodes of the amplifying transistors and the floating diffusions, wherein
    the plurality of power supply lines and the plurality of vertical signal lines extend in a column direction,
    first photodiode groups of the photodiodes are between pairs of power supply lines,
    second photodiode groups of the photodiodes are between pairs of vertical signal lines,
    the pairs of power supply lines and the pairs of vertical signal lines are positioned alternately, and
    the plurality of power supply lines and the plurality of vertical signal lines are shifted to the center of the pixel array.

2. The solid-state imaging device of claim 1, wherein the plurality of power supply lines, the plurality of floating diffusion wires and the plurality of vertical signal lines are formed in a first wiring layer.

3. The solid-state imaging device of claim 1, wherein the pair of power supply lines are connected with each other.

4. The solid-state imaging device of claim 1, wherein the plurality of power supply lines is independent individually.

5. The solid-state imaging device of claim 1, wherein the plurality of vertical signal lines is independent individually.

6. The solid-state imaging device of claim 1, wherein the plurality of power supply lines has branch portions which are located between photodiodes adjacent in vertical direction.

7. The solid-state imaging device of claim 1, wherein the plurality of vertical signal lines has branch portions which are located between photodiodes adjacent in vertical direction.

8. The solid-state imaging device of claim 1, further comprising:
    transfer gate electrodes; and
    transfer gate electrode wires, wherein
    the transfer gate electrode wires extend in horizontal direction.

9. The solid-state imaging device of claim 8, wherein the transfer gate electrodes and the transfer gate electrode wires are formed at the same time.

10. The solid-state imaging device of claim 1, further comprising:
    reset gate electrodes; and
    reset gate electrode wires, wherein
    the reset gate electrode wires extend in horizontal direction.

11. The solid-state imaging device of claim 10, wherein the reset gate electrodes and the reset gate electrode wires are formed at the same time.

12. The solid-state imaging device of claim 1, further comprising:
    a substrate contact wire formed in a second wiring layer and between the photodiodes.

13. The solid-state imaging device of claim 12, wherein the substrate contact wire is located between the photodiodes in vertical direction.

14. The solid-state imaging device of claim 12, wherein the substrate contact wire is located between the photodiodes in horizontal direction.

* * * * *